(12) United States Patent
Allen et al.

(10) Patent No.: US 9,851,639 B2
(45) Date of Patent: Dec. 26, 2017

(54) PHOTOACID GENERATING POLYMERS CONTAINING A URETHANE LINKAGE FOR LITHOGRAPHY

(75) Inventors: Robert David Allen, San Jose, CA (US); Phillip Joe Brock, Sunnyvale, CA (US); Masaki Fujiwara, Tokyo (JP); Kazuhiko Maeda, Tokyo (JP); Hoa D. Truong, San Jose, CA (US)

(73) Assignees: International Business Machines Corporation, Armonk, NY (US); Central Glass Co., Ltd., Ube-shi, Yamaguchi (JP)

( * ) Notice: Subject to any disclaimer, the term of this patent is extended or adjusted under 35 U.S.C. 154(b) by 1018 days.

(21) Appl. No.: 13/436,881

(22) Filed: Mar. 31, 2012

(65) Prior Publication Data

US 2013/0260313 A1    Oct. 3, 2013

(51) Int. Cl.
| | |
|---|---|
| G03F 7/004 | (2006.01) |
| C08F 228/02 | (2006.01) |
| G03F 7/039 | (2006.01) |
| G03F 7/11 | (2006.01) |
| G03F 7/20 | (2006.01) |

(52) U.S. Cl.
CPC .......... G03F 7/0397 (2013.01); C08F 228/02 (2013.01); G03F 7/0045 (2013.01); G03F 7/0046 (2013.01); G03F 7/11 (2013.01); G03F 7/2041 (2013.01)

(58) Field of Classification Search
CPC ........ G03F 7/0045; G03F 7/0397; G03F 7/30; C08F 228/02
USPC .............................. 430/270.1, 326, 907, 910
See application file for complete search history.

(56) References Cited

U.S. PATENT DOCUMENTS

| | | |
|---|---|---|
| 6,136,501 A | 10/2000 | Trefonas, III et al. |
| 6,517,994 B2 | 2/2003 | Watanabe |
| 7,014,980 B2 | 3/2006 | Allen et al. |
| 7,378,683 B2 | 5/2008 | Endoh et al. |
| 7,638,264 B2 | 12/2009 | Li et al. |
| 8,034,534 B2 | 10/2011 | Farnham et al. |
| 2009/0111344 A1 | 4/2009 | Murphy et al. |
| 2009/0246694 A1 | 10/2009 | Ohsawa et al. |
| 2009/0274978 A1 | 11/2009 | Ohashi et al. |
| 2010/0168337 A1 | 7/2010 | Allen et al. |
| 2010/0304303 A1* | 12/2010 | Maeda et al. ............... 430/286.1 |
| 2011/0003247 A1* | 1/2011 | Ohashi et al. ............. 430/270.1 |
| 2011/0008727 A1 | 1/2011 | Allen et al. |
| 2011/0033803 A1 | 2/2011 | Hatakeyama et al. |
| 2011/0065857 A1 | 3/2011 | Terui et al. |
| 2011/0091812 A1 | 4/2011 | Hatakeyama et al. |
| 2011/0217654 A1 | 9/2011 | Yamato et al. |
| 2011/0319652 A1 | 12/2011 | Jodry et al. |
| 2012/0322006 A1* | 12/2012 | Kato et al. ................. 430/283.1 |

FOREIGN PATENT DOCUMENTS

| | | |
|---|---|---|
| JP | 3017113 A | 1/1991 |
| JP | 2006178317 A | 7/2006 |

OTHER PUBLICATIONS

Hinsberg, et al., "Effect of Resist Components on Image Spreading During Postexposure Bake of Chemically Amplified Resists," Proceedings of SPIE vol. 3999 (2000), p. 148-160, Feb. 28, 2000.
Hinsberg, et al., "Liquid Immersion Lithography—Evaluation of Resist Issues," Proceedings of SPIE vol. 5376, 2004, p. 21-33, Feb. 23, 2004.
U.S. Appl. No. 13/333,322, filed Dec. 21, 2011, Kato et al.

* cited by examiner

*Primary Examiner* — John S Chu
(74) *Attorney, Agent, or Firm* — Michael R. Roberts

(57) ABSTRACT

A photoacid generating polymer (PAG polymer) comprises i) a first repeat unit of capable of reacting with a photogenerated acid to form a carboxylic acid containing repeat unit, ii) a second repeat unit of capable of forming the photogenerated acid, and iii) a third repeat unit comprising a norbornyl ester, wherein a norbornyl ring of the norbornyl ester comprises a monovalent substituent having the formula $*-L'-C(CF_3)_2(OH)$. L' is a divalent linking group comprising at least one carbon and the starred bond of L' is linked to the norbornyl ring. The first repeat unit, second repeat unit, and the third repeat unit are covalently bound repeat units of the PAG polymer.

33 Claims, 6 Drawing Sheets

1) Transfer
2) Etch

Example 4, 22 nm L/S, PEB 120 C

Example 5, 22 nm L/S, PEB 120 C

PHOTOACID GENERATING POLYMERS CONTAINING A URETHANE LINKAGE FOR LITHOGRAPHY

PARTIES TO A JOINT RESEARCH AGREEMENT

This invention was made under a joint research agreement between International Business Machines Corporation, a New York corporation, and Central Glass Co., Ltd., a Tokyo, Japan corporation.

BACKGROUND

The present invention relates to polymer photoresists with bound photoacid groups containing a urethane linkage, and methods of use, and more specifically, to polymers bearing pendant triarylsulfonium sulfonate groups for high resolution lithography.

The patterning of radiation sensitive polymeric films with high energy radiation flux such as photons, electrons, or ion beams is the principle means of defining high resolution circuitry found in semiconductor devices. The radiation sensitive films, often referred to as photoresists regardless of the radiation source, generally consist of multicomponent formulations that are coated onto a desired substrate such as a silicon wafer. The photoresist film is then exposed to a radiation. The radiation is most commonly ultraviolet light at wavelengths of 436, 365, 257, 248, 193 or 157 nanometers (nm), or a beam of electrons or ions, or soft x-ray radiation, also referred to as extreme ultraviolet (EUV) or x-rays. The radiation is exposed patternwise to induce a chemical transformation that renders the solubility of the exposed regions of the film different from that of the non-exposed areas. The film is then heated to enhance the radiation induced chemical transformation. After heating, the film is treated with an appropriate developer, usually a dilute, basic aqueous solution, such as aqueous tetraethylammonium hydroxide (TMAH) to develop the photoresist image on the wafer. Typical photoresist compositions generally comprise a polymer (which can be radiation sensitive or non-sensitive), a radiation sensitive component, a casting solvent, and optional performance enhancing additives. High performance photoresist compositions, in terms of sensitivity to radiation and resolution capability, are "chemically-amplified" photoresists. These photoresist compositions provide high resolution, high contrast, and high sensitivity that are not generally provided by other photoresists. Chemically amplified photoresists are based on a catalytic mechanism that allows a relatively large number of chemical events such as, for example, deprotection reactions in the case of positive-tone photoresists brought about by the application of a relatively low dose of radiation that induces formation of the catalyst, often a strong acid.

Most of the current positive-tone photoresist compositions comprise aqueous base soluble functional groups that are sufficiently protected with acid sensitive groups (e.g., esters capable of being cleaved by a strong acid to produce a carboxylic acid) such that the photoresist layer initially will not dissolve in an aqueous base developer. During exposure to radiation, a photoacid generator (PAG) present in the photoresist layer produces strong acid, which then catalyzes the removal of the acid sensitive groups on heating in a post-exposure bake (PEB). This process produces aqueous base soluble material in the exposed area, which is removed during development with a basic aqueous developer, thereby producing topographical patterned layers.

Many of the current polymers used in photoresist compositions contain acid sensitive carboxylic ester groups, which are insoluble in aqueous base until the ester groups are deprotected by a photo-generated acid. The mechanism of the acid-catalyzed deprotection of the esters in the photoresist layer is shown in Scheme 1.

Scheme 1.

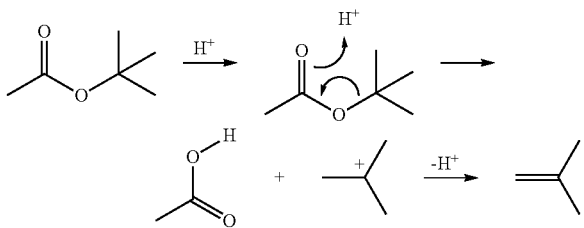

Water is not needed for the ester deprotection reaction to occur. However, chemically amplified photoresists, particularly in the sub-50 nm regime, experience diminished image resolution or contrast, often referred to as "image blur" (e.g., Hinsberg et al., Proc. SPIE, (2000), 3999, 148). Although chemically-amplified resists have been developed for 248, 193 and EUV lithography, barriers to achieving higher resolution and smaller feature sizes remain due to physical, processing and material limitations. Image blur is generally thought to result from two contributing thermally driven factors: gradient-driven acid diffusion and reaction propagation, the result being a distortion in the developable image (e.g., line pattern) compared to the projected aerial image transferred onto the film. The key metric controlling the image blur is the ratio R=(average rate of acid catalyzed deprotection)/(average rate of acid diffusion). The greater the value of the ratio R is, the lower the image blur (Hinsberg et al., Proc. SPIE, (2004), 5376, 21).

One approach to improving line resolution is to incorporate the photo acid generator (PAG) into the polymer structure rather than using it as a small molecule additive. Japanese publication JP2006178317 to Hatakeyama et al. describes a large number of PAG-containing monomers that can be incorporated into a PAG polymer. Despite the improvements in resolution with these materials, existing PAG polymers are generally limited to a 28 nm line/space patterns.

Therefore, ongoing needs exist for photoresist compositions having improved image resolution capability and improved methods of patterning substrates.

SUMMARY

Accordingly, a photoacid generating polymer (PAG polymer) is disclosed, comprising:

a first repeat unit of formula (1):

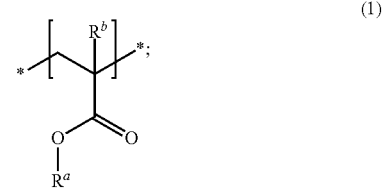

(1)

wherein $R^a$ is an acid sensitive group and $R^b$ is hydrogen or methyl, wherein the first repeat unit is capable of reacting with a photogenerated acid to form a carboxylic acid containing repeat unit;

a second repeat unit of formula (2):

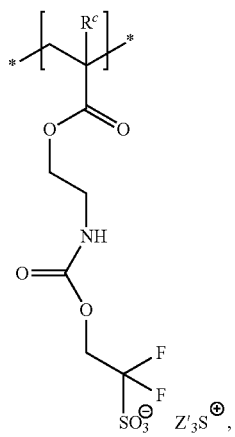

(2)

wherein $R^c$ is hydrogen or methyl, and $Z'_3S^\oplus$ is a triarylsulfonium counterion, and each $Z'$ is an independent monovalent aryl group, wherein the second repeat unit is capable of forming the photogenerated acid; and a third repeat unit comprising a norbornyl ester, wherein a norbornyl ring of the norbornyl ester comprises a monovalent substituent having the formula *-L'-C(CF$_3$)$_2$(OH), wherein L' is a divalent linking group comprising at least one carbon and the starred bond of L' is linked to the norbornyl ring;

wherein the first repeat unit, second repeat unit, and the third repeat unit are covalently bound repeat units of the PAG polymer.

Also disclosed is a photoacid generating polymer (PAG polymer), comprising:

a first repeat unit of formula (1):

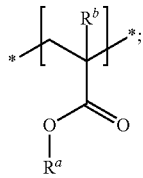

(1)

wherein $R^a$ is an acid sensitive group and $R^b$ is hydrogen or methyl, wherein the first repeat unit is capable of reacting with a photogenerated acid to form a carboxylic acid containing repeat unit;

a second repeat unit of formula (2):

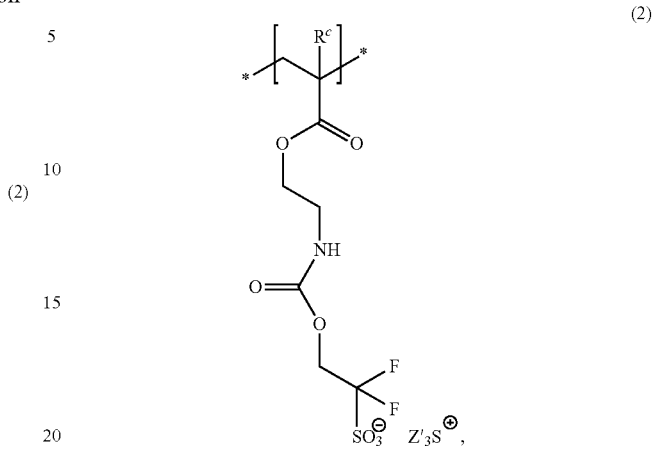

(2)

wherein $R^c$ is hydrogen or methyl, and $Z'_3S^\oplus$ is a triarylsulfonium counterion, and each $Z'$ is an independent monovalent aryl group, wherein the second repeat unit is capable of forming the photogenerated acid; and a third repeat unit comprising a norbornyl ester, wherein a norbornyl ring of the norbornyl ester comprises a monovalent substituent having the formula *-L'—NHS(=O)$_2$(CF$_3$), wherein L' is a divalent linking group comprising at least one carbon and the starred bond of L' is linked to the norbornyl ring;

wherein the first repeat unit, the second repeat unit, and the third repeat unit are covalently bound repeat units of the PAG polymer.

Also disclosed is a method of preparing a photoacid generating polymer (PAG polymer), comprising:

forming a reaction mixture comprising:
i) a solvent,
ii) a polymerization initiator,
iii) a first polymerizable monomer of formula (7):

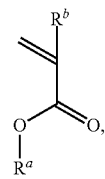

(7)

wherein $R^a$ is an acid sensitive group and $R^b$ is hydrogen or methyl, wherein the first polymerizable monomer is capable of forming a first repeat unit, the first repeat unit capable of reacting with a photogenerated acid to form a carboxylic acid containing repeat unit;

iv) a second polymerizable monomer of formula (8):

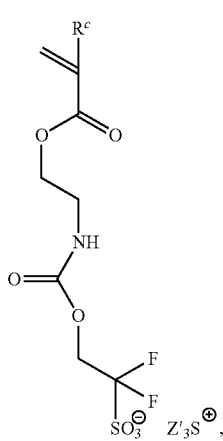
(8)

wherein $R^c$ is hydrogen or methyl, and $Z'_3S^\oplus$) is a triarylsulfonium counterion wherein each Z' is an independent monovalent aryl group, and wherein the second polymerizable monomer is capable of forming a second repeat unit, the second repeat unit capable of forming the photogenerated acid; and v) a third polymerizable monomer comprising a norbornyl ester, wherein a norbornyl ring of the norbornyl ester comprises a monovalent substituent having the formula *-L'-C(CF$_3$)$_2$(OH), wherein L' is a divalent linking group comprising at least one carbon and the starred bond of L' is linked to the norbornyl ring, and wherein the third polymerizable monomer is capable of forming a third repeat unit comprising a norbornyl ester; and agitating and optionally heating the mixture, thereby forming the PAG polymer, wherein the first repeat unit, the second repeat unit, and the third repeat unit are covalently bound repeat units of the PAG polymer.

Another method of preparing a photoacid generating polymer (PAG polymer) is disclosed, comprising:

forming a reaction mixture comprising:

i) a solvent, ii) a polymerization initiator, iii) a first polymerizable monomer of formula (7):

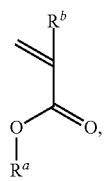
(7)

wherein $R^a$ is an acid sensitive group and $R^b$ is hydrogen or methyl, wherein the first polymerizable monomer is capable of forming a first repeat unit, the first repeat unit capable of reacting with a photogenerated acid to form a carboxylic acid containing repeat unit;

iv) a second polymerizable monomer of formula (8):

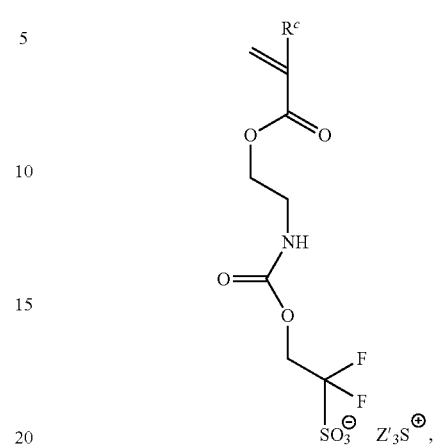
(8)

wherein $R^c$ is hydrogen or methyl, and $Z'_3S^\oplus$) is a triarylsulfonium counterion wherein each Z' is an independent monovalent aryl group, and wherein the second polymerizable monomer is capable of forming a second repeat unit, the second repeat unit capable of forming the photogenerated acid; and v) a third polymerizable monomer comprising a norbornyl ester, wherein a norbornyl ring of the norbornyl ester comprises a monovalent substituent having the formula *-L'—NHS(=O)$_2$(CF$_3$), wherein L' is a divalent linking group comprising at least one carbon and the starred bond of L' is linked to the norbornyl ring, and wherein the third polymerizable monomer is capable of forming a third repeat unit comprising a norbornyl ester; and agitating and optionally heating the mixture, thereby forming the PAG polymer, wherein the first repeat unit, the second repeat unit, and the third repeat unit are covalently bound repeat units of the PAG polymer.

Also disclosed is a photoresist composition comprising an above-described PAG polymer, a solvent, and an optional base quencher.

Also disclosed is a lithographic process, comprising:

disposing on a substrate a photoresist composition comprising an above-described PAG polymer, a solvent, and an optional base quencher;

removing the solvent, thereby forming a photoresist layer disposed on the substrate; optionally heating the photoresist layer in a post-application bake;

imagewise exposing the photoresist layer or the heated photoresist layer to a radiation, thereby forming an exposed photoresist layer comprising regions of exposed photoresist and regions of non-exposed photoresist;

optionally heating the exposed photoresist layer in a post-exposure bake;

treating the exposed photoresist layer or the heated exposed photoresist layer with a developer, thereby forming a relief pattern; and optionally transferring the relief pattern to the substrate.

The above-described and other features and advantages of the present invention will be appreciated and understood by those skilled in the art from the following detailed description, drawings, and appended claims.

DETAILED DESCRIPTION

Figure 1A:
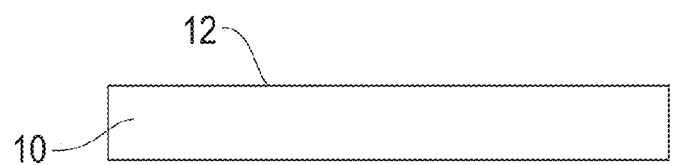
FIGS. 1A to 1E are schematic layer diagrams showing a method of forming a multi-layered structure that includes a topographical patterned layer comprising exposed photoresist composition.

Photoacid generating (PAG) copolymers, referred to as PAG polymers, are disclosed for use in high resolution lithographic patterning. The line/space resolution obtained with the PAG polymers is, in general, 50% to 100% better than similar materials in which the photoacid generating group is not bound to a polymer. High resolution patterns can be obtained using any appropriate radiation, including ultraviolet, extreme ultraviolet (EUV), and/or e-beam.

The PAG polymers are capable of "chemical amplification", a term well known in the art of photoresists, referring to the catalytic reaction of functional groups of the photoresist, usually a polymer, with a photogenerated acid species. The most common chemically-amplified photoresists utilize photoacid generators (PAGs) and the most commonly employed reaction mechanism is the acid-catalyzed deprotection of protected polar functional groups. For example, acid-sensitive esters can be catalytically converted to more polar carboxylic acid groups by a photo-released acid. Chemical amplification typically occurs during a post-exposure bake (PEB), when one photo-generated acid molecule catalyzes the deprotection of many ester groups in the exposed areas. The resulting deprotected photoresist has increased polarity compared to the as-exposed photoresist or the non-exposed photoresist.

In the following description, the term "(meth)acrylate" with parentheses means "methacrylate and/or acrylate." A (meth)acrylate monomer has a polymerizable methacrylate and/or acrylate ester group. A (meth)acrylate polymer is a polymer formed by polymerization of one or more polymerizable (meth)acrylate monomers.

The term "(meth)acrylate ester repeat unit" refers to a repeat unit formed by polymerization (e.g., free radical polymerization) of a (meth)acrylate monomer.

The PAG polymer comprises an acid sensitive first repeat unit, a photoacid generating second repeat unit, and a third repeat unit containing a norbornyl ester. These repeat units are covalently bound through the backbone of the PAG polymer. The PAG polymer can have a random or a block structure.

The first repeat unit is capable of reacting with a photogenerated acid to form a carboxylic acid containing repeat unit. The first repeat unit has the formula (1):

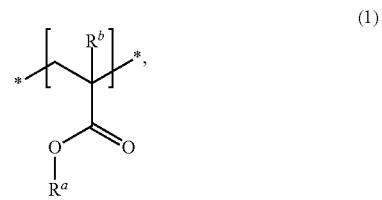

wherein $R^a$ is an acid sensitive group comprising at least one carbon, $R^b$ is hydrogen or methyl. The starred bonds represent attachment points to other portions of the PAG polymer.

The PAG polymer can comprise the first repeat unit in an amount of about 30 to about 45 mole percent based on total moles of repeat units in the PAG polymer.

The PAG polymer further comprises a second repeat unit of formula (2):

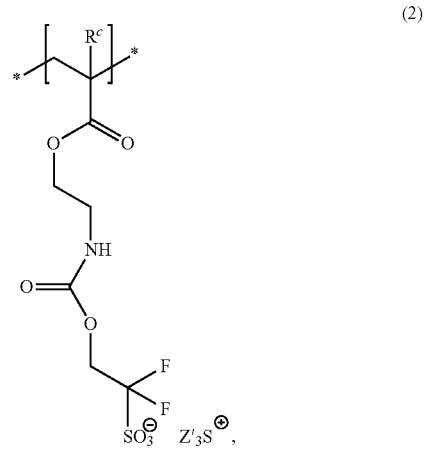

wherein $R^c$ is hydrogen or methyl, $Z'_3S^\oplus$ is a triarylsulfonium ion wherein each Z' is an independent monovalent aryl group. Exemplary aryl groups include phenyl, tolyl, xylyl, and naphthyl. In an embodiment, each Z' is phenyl and $Z'_3S^\oplus$ represents a triphenyl sulfonium ion ($TPS^\oplus$). In another embodiment, $R^c$ is methyl and each Z' is phenyl. The second repeat unit is capable of forming a photogenerated acid. The photogenerated acid is capable of reacting with an acid sensitive group of the first repeat unit, thereby forming a carboxylic acid containing repeat unit.

The PAG polymer can comprise the second repeat unit in an amount of about 2.5 to about 8 mole percent based on total moles of repeat units in the PAG polymer.

The PAG polymer further comprises a third repeat unit comprising a norbornyl ester (a norbornyl ring bonded to an ester oxygen). Preferably, the norbornyl ester is pendant to the PAG polymer backbone. In an embodiment, the norbornyl ring of the third repeat unit comprises a monovalent substituent having the formula *-L'-C(CF$_3$)$_2$(OH), wherein L' is a divalent linking group comprising at least one carbon and the starred bond of L' is linked to the norbornyl ring. This third repeat unit is also referred to as a HFA repeat unit. The HFA repeat unit can be a single structural isomer and/or a single stereoisomer, or be present in the PAG polymer as a mixture of structural isomers and/or stereoisomers. HFA repeat units can be present in the PAG polymer singularly or in combination.

More specific HFA repeat units have the formula (3):

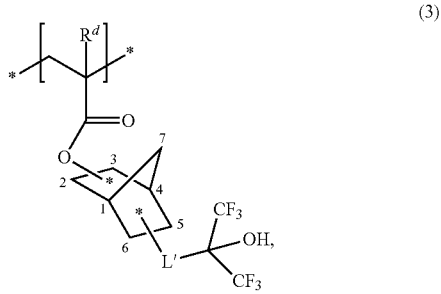

(3)

wherein $R^d$ is hydrogen or methyl and L' is a divalent linking group comprising at least one carbon. Structural isomers of formula (3) have the same chemical formula as formula (3) with the *-L'-C(CF$_3$)$_2$(OH) group and/or the ester oxygen linked to different positions of the norbornyl ring. The ester oxygen of the HFA repeat unit can be bound to carbon 2 or carbon 3 of the norbornyl ring. The linking group L' can be bound to carbon 5 or carbon 6. Exemplary L' groups include methylene (*—CH$_2$—*), ethylene (*—CH$_2$CH$_2$—*), and propylene (*—CH$_2$CH$_2$CH$_2$—*). Stereochemistry is not shown in formula (3). Each asymmetric carbon can independently have R or S stereochemistry, or be present in the PAG polymer as a mixture of R and S stereoisomers.

The HFA repeat unit imparts additional desirable properties to the PAG polymer including but not limited to: substrate adhesion, wetting properties, enhanced solubility, and/or etch resistance.

The PAG polymer can comprise the HFA repeat unit in an amount of about 15 mole percent to about 55 mole percent based on total moles of repeat units in the PAG polymer.

A still more specific HFA repeat unit has the structure (I):

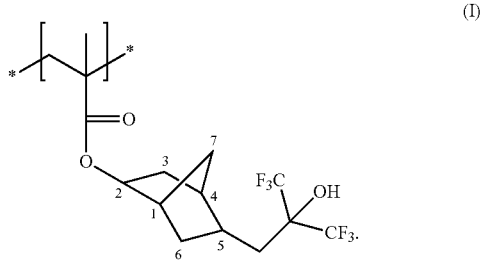

(I)

The HFA repeat unit can include additional substituents linked to one or more of the norbornyl carbons of formula (3). Substituents include alkyl groups and/or cycloalkyl groups comprising at least one carbon (e.g., methyl, ethyl, propyl, cyclopropyl). Substituents can include a fused ring linked to the norbornyl ring structure, as in the following non-limiting structure (II):

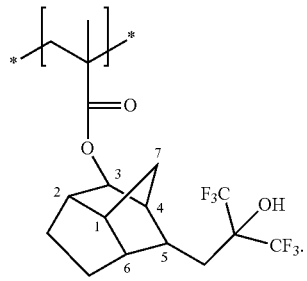

(II)

In another embodiment, the third repeat unit comprises a norbornyl ester, wherein the norbornyl ring has a monovalent substituent having the formula *-L'—NHS(=O)$_2$(CF$_3$), wherein L' is a divalent linking group comprising at least one carbon and the starred bond of L' is linked to the norbornyl ring. This repeat unit is referred to as a FSA repeat unit. The FSA repeat unit can be a single structural isomer and/or single stereoisomer. Alternatively the FSA repeat unit can be a mixture of structural isomers and/or stereoisomers. FSA repeat units can be present in the PAG polymer singularly or in combination.

A more specific FSA repeat unit has the formula (4):

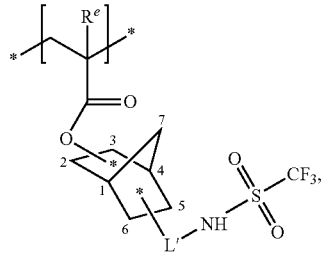

(4)

wherein $R^e$ is hydrogen or methyl and L' is a divalent linking group comprising at least one carbon. Structural isomers of formula (4) have the same chemical formula as formula (3) with the *-L'-NHS(=O)$_2$(CF$_3$) group and/or the ester oxygen linked to different positions of the norbornyl ring. The ester oxygen of the FSA repeat unit can be bound to carbon labeled 2 or carbon labeled 3 of the norbornyl ring. The linking group L' can be bound to carbon 5 or carbon 6. Exemplary L' groups include methylene (*—CH$_2$—*), ethylene (*—CH$_2$CH$_2$—*), and propylene (*—CH$_2$CH$_2$CH$_2$—*). Stereochemistry is not shown in formula (4). Each asymmetric carbon can independently have R or S stereochemistry, or be present as a mixture of R and S stereoisomers.

The PAG polymer can comprise the FSA repeat unit in an amount of about 15 to about 55 mole percent based on total moles of repeat units in the PAG polymer. The sum of the mole percents of all the repeat units of the PAG polymer is 100 mole percent.

The FSA repeat unit can include additional substituents linked to one or more of the norbornyl carbons of formula (4). Substituents include alkyl groups and/or cycloalkyl groups comprising at least one carbon (e.g., methyl, ethyl, propyl, cyclopropyl). Substituents can include a fused ring linked to the norbornyl ring structure as exemplified above in structure (II).

In an embodiment, the FSA repeat unit has the structure (III):

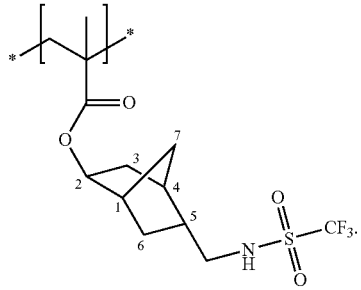

(III)

The PAG polymer can comprise a combination of HFA and FSA repeat units.

The PAG polymer can optionally further comprise a fourth repeat unit of formula (5):

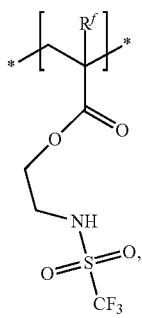

(5)

wherein $R^f$ is hydrogen or methyl.

The PAG polymer can optionally further comprise a fourth repeat unit of formula (6):

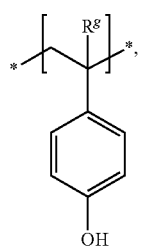

(6)

wherein $R^g$ is hydrogen or methyl.

The PAG polymer can optionally further comprise a fourth repeat unit comprising a lactone group to enhance the lithographic performance of the PAG polymer. Exemplary repeat units comprising lactones include structures (IV) and (V):

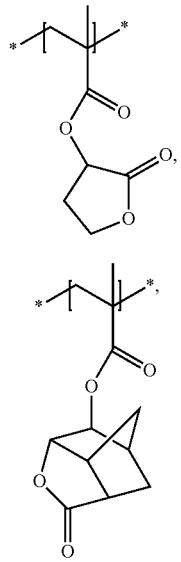

(IV)

(V)

and combinations thereof.

The PAG polymers are preferably prepared by radical polymerization of a reaction mixture comprising an acid sensitive first polymerizable monomer, a photoacid generating second polymerizable monomer, and a third polymerizable monomer containing a norbornyl ester.

The first polymerizable monomer has the formula (7):

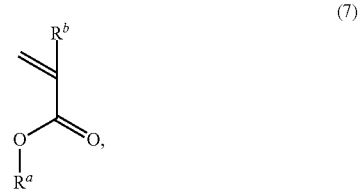

(7)

wherein $R^a$ is an acid cleavable group comprising at least one carbon, and $R^b$ is hydrogen or methyl. The first polymerizable monomer is capable of forming the first repeat unit of the PAG polymer. The first repeat unit of the PAG polymer is capable of reacting with a photogenerated acid to form a carboxylic acid containing repeat unit.

Acid sensitive moieties include tertiary alkyl carbonates, tertiary alkyl esters, tertiary alkyl ethers, acetals or ketals. Non-limiting examples of acid sensitive first polymerizable monomers of formula (7) include t-butyl methacrylate (TBMA), 1-ethyl-1-cyclopentyl methacrylate (ECPMA), 1-methyl-1-cyclopentyl methacrylate (MCPMA), 1-ethyl-1-cyclooctyl methacrylate (ECOMA), 2-ethyl-2-adamantyl methacrylate (EAdMA), 2-methyl-2-adamantyl methacrylate (MAdMA), and combinations thereof:

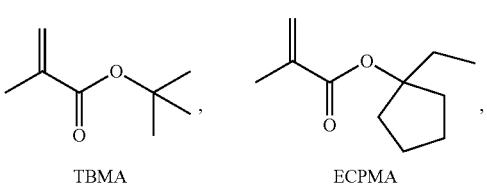

TBMA, ECPMA

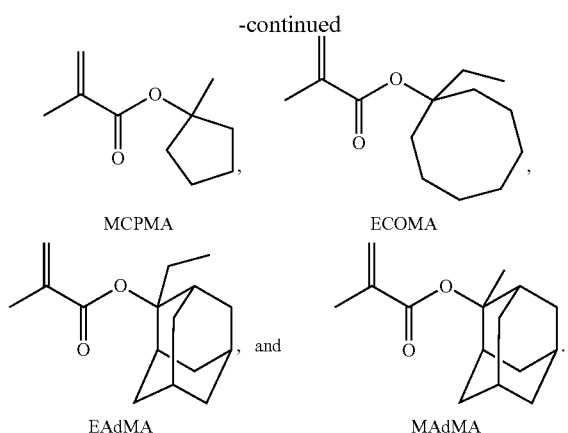

MCPMA        ECOMA

EAdMA        MAdMA

The reaction mixture can comprise the acid sensitive first polymerizable monomer in an amount of about 30 mole percent to about 45 mole percent based on total moles of polymerizable monomer used to prepare the PAG polymer.

The reaction mixture further comprises a second polymerizable monomer, a (meth)acrylate, referred to as the PAG monomer. The PAG monomer has formula (8):

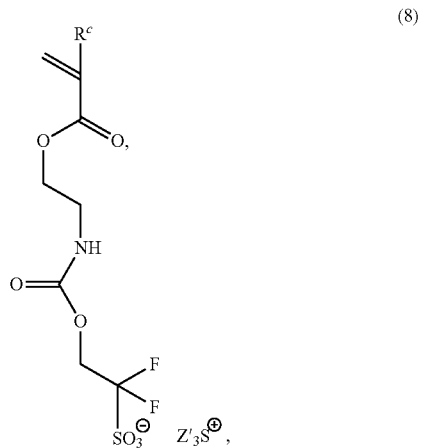

(8)

wherein $R^c$ is hydrogen or methyl, and $Z'_3S^\oplus$ is a triarylsulfonium ion wherein $Z'$ is an aryl group. The second polymerizable monomer is capable of forming the second repeat unit of the PAG polymer, the second repeat unit capable of forming the photogenerated acid. In an embodiment, $R^c$ is methyl, $Z'$ is phenyl, and $Z'_3S^\oplus$ represents a triphenyl sulfonium ion ($TPS^\oplus$). In this instance, the PAG monomer is referred to as TPS-UMA:

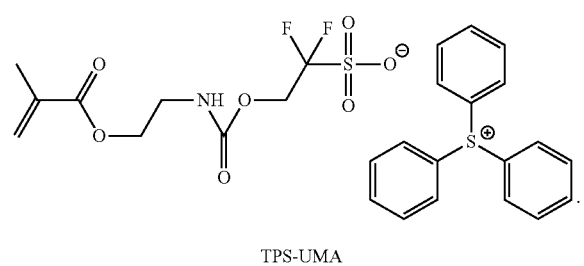

TPS-UMA

The PAG monomer TPS-UMA contains a potentially basic urethane linkage. Generally, materials containing a basic chemical functionality (particularly amines or amides) prevent chemically amplified photoresists from functioning. Therefore, the presence of the urethane chemical moiety in a functioning PAG polymer repeat unit (second repeat unit) is unusual.

TPS-UMA is incorporated into the polymer backbone such that the photogenerated acid remains attached to the polymer backbone after it is generated. The acid group has less mobility compared to a corresponding unbound PAG group. Consequently, less post-exposure bake "acid diffusion induced image blur" occurs, and in turn less degradation of the developed photoresist image. High resolution photoresist images can be obtained even with a PAG polymer requiring a high PEB temperature for acid-catalyzed deprotection. This permits a wide choice of acid sensitive monomers for tuning the physical and/or performance properties of the PAG polymer.

The reaction mixture can comprise the PAG monomer in an amount of about 2.5 mole percent to about 8 mole percent based on total moles of polymerizable monomer used to prepare the PAB polymer.

The polymerization reaction mixture comprises a third polymerizable monomer comprising a pendant norbornyl ester. The third polymerizable monomer is preferably a (meth)acrylate. The third polymerizable monomer is capable of forming the third repeat unit of the PAG polymer, the third repeat unit comprising a norbornyl ester. In an embodiment, a norbornyl ring of the third polymerizable monomer comprises a monovalent substituent having the formula *-L'-C(CF$_3$)$_2$(OH), wherein L' is a divalent linking group comprising at least one carbon and the starred bond of L' is linked to the norbornyl ring. This third monomer is referred to as a HFA monomer. The HFA monomer can be a single structural isomer and/or single stereoisomer, or can be present in the reaction mixture as a mixture of structural isomers and/or stereoisomers. HFA monomers can be used singularly or in combination.

More specific HFA monomers are represented by formula (9):

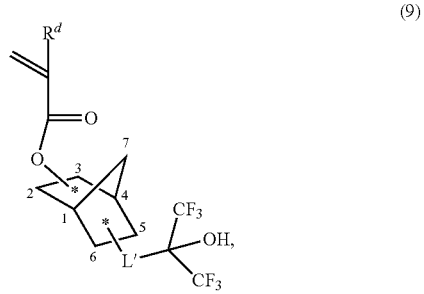

(9)

wherein $R^d$ is hydrogen or methyl and L' is a divalent linking group comprising at least one carbon. Structural isomers of formula (9) have the same chemical formula as formula (9) with the *-L'-C(CF$_3$)$_2$(OH) group and/or the ester oxygen linked to different positions of the norbornyl ring. The ester oxygen of the HFA monomer can be attached to carbon labeled 2 or carbon labeled 3 of the norbornyl ring. The linking group L' can be bound to carbon 5 or carbon 6. Exemplary L' groups include methylene (*—CH$_2$—*), ethylene (*—CH$_2$CH$_2$—*), and propylene (*—CH$_2$CH$_2$CH$_2$—*). Stereochemistry is not shown in formula (9). Each asymmetric carbon can independently have R or S stereochemistry, or be present in the reaction mixture as a combination of R and S stereoisomers (e.g., a racemic mixture).

A still more specific HFA monomer is 2-{[5-(1',1',1'-trifluoro-2'-trifluoromethyl-2'-hydroxy)propyl]norbornyl]}methacrylate (NbHFAMA):

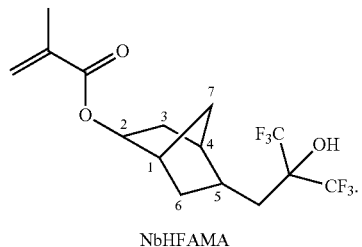

NbHFAMA

The HFA monomer can include additional substituents linked to one or more of the norbornyl carbons of formula (9). Substituents include alkyl groups and/or cycloalkyl groups comprising at least one carbon (e.g., methyl, ethyl, propyl, cyclopropyl). Substituents can include a fused ring linked to the norbornyl ring structure, as in the following non-limiting structure (VI):

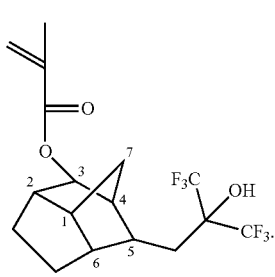

In another embodiment, the third polymerizable monomer comprises a norbornyl ester, wherein the norbornyl ring has a monovalent substituent having the formula *-L'-NHS(=O)$_2$(CF$_3$), wherein L' is a divalent linking group comprising at least one carbon and the starred bond of L' is linked to the norbornyl ring. This monomer is referred to as a FSA monomer. The FSA monomer can be a single structural isomer and/or single stereoisomer or a mixture of structural isomers and/or stereoisomers. FSA repeat units can be used singularly or in combination.

A more specific FSA monomer is represented by formula (10):

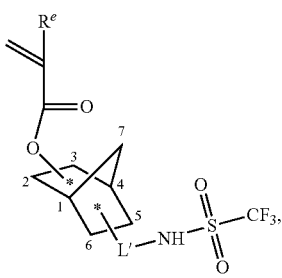

wherein each $R^e$ is hydrogen or methyl and L' is a divalent linking group comprising at least one carbon. Structural isomers of formula (10) have the same chemical formula as formula (10) with the *-L'-NHS(=O)$_2$(CF$_3$) group and/or the ester oxygen linked to different positions of the norbornyl ring. The ester oxygen of the FSA monomer can be attached to carbon labeled 2 or carbon labeled 3 of the norbornyl ring. The linking group L' can be bound to carbon 5 or carbon 6. Exemplary L' groups include methylene (*—CH$_2$—*), ethylene (*—CH$_2$CH$_2$—*), and propylene (*—CH$_2$CH$_2$CH$_2$—*). Stereochemistry is not shown in formula (10). Each asymmetric carbon can independently have R or S stereochemistry, or be present as a mixture of R and S stereoisomers.

The FSA monomer can include additional substituents linked to one or more of the norbornyl carbons of formula (4). Substituents include alkyl groups and/or cycloalkyl groups comprising at least one carbon (e.g., methyl, ethyl, propyl, cyclopropyl). Substituents can include a fused ring linked to the norbornyl ring structure as exemplified in structure (II) above.

In an embodiment, the FSA monomer is 5-[(trifluoromethylsulfonylamino)methyl]-2-norbornyl methacrylate (NbNHCF3SO2MA)

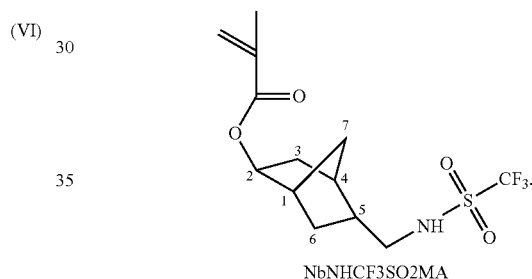

NbNHCF3SO2MA

The reaction mixture can comprise the FSA monomer in an amount of about 15 to about 55 mole percent based on total moles of polymerizable monomer used to prepare the PAB polymer.

The reaction mixture can comprise a combination of HFA and FSA monomers.

The polymerization reaction mixture can optionally further comprise a polymerizable monomer of formula (11):

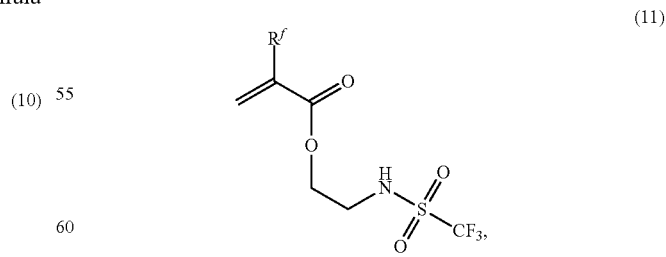

wherein $R^f$ is hydrogen or methyl. In an embodiment, $R^f$ is methyl.

The polymerization reaction mixture can optionally further comprise an aromatic alcohol monomer of formula (12):

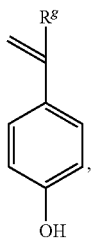

(12)

wherein $R^g$ is hydrogen or methyl. More specifically, the aromatic alcohol monomer is 4-hydroxystyrene (SOH):

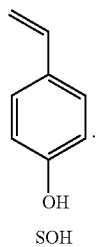

SOH

The aromatic alcohol monomer can be a (meth)acrylate monomer having pendant aromatic alcohol group.

The polymerization reaction mixture can optionally further comprise a polymerizable lactone to enhance the lithographic performance of the PAG polymer. Exemplary lactone monomers include:

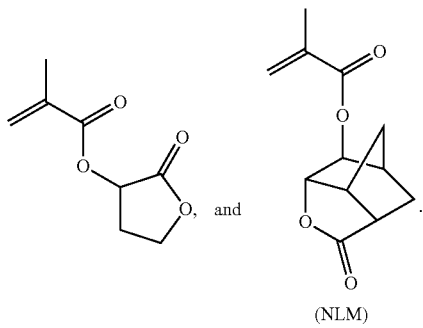 [SMILES: C=C(C)C(=O)OC1CCOC1=O ; C=C(C)C(=O)OC1C2CC3C(=O)OC1C3C2]

(NLM)

The monomers can be polymerized by conventional means to form a PAG polymer. For example, the desired monomers can be dissolved in an appropriate solvent that, at reflux, will afford a medium that maintains a constant temperature suitable for activation of the chosen initiator without inducing side reactions amongst the functional groups of the monomers. The solution can be prepared so as to afford a relatively high concentration of monomer, for example 25 wt % (weight percent), based on total weight of the solution. The chosen initiator (e.g., azobisisobutyronitrile (AIBN)) is added and the solution degassed by bubbling with dry nitrogen. The reaction mixture is then agitated and optionally heated, thereby forming the PAG polymer. In an embodiment the reaction mixture is allowed to reflux for several hours under a nitrogen atmosphere, followed by cooling the solution to room temperature. The PAG polymer can be isolated by precipitation into an excess volume, for example, twenty-fold, of an appropriate non-solvent. The PAG polymer can be isolated by filtration, washed with the non-solvent and dried to constant weight under vacuum.

The PAG polymer has a molecular weight of about 500 to about 500,000 daltons, preferably about 1,000 to about 100,000 daltons, and most preferably of about 2,000 to about 50,000 daltons.

Figure 1B:
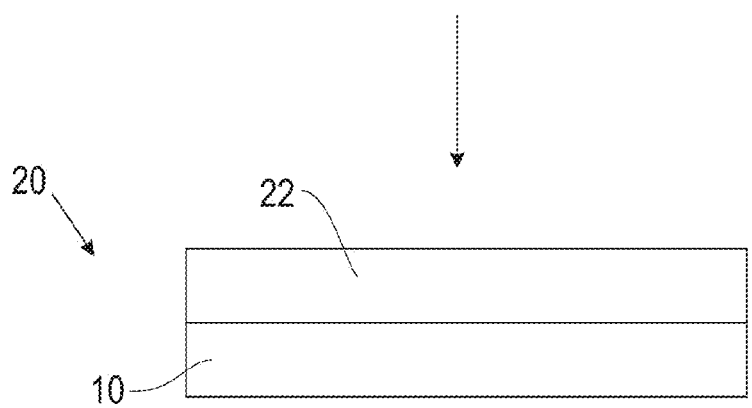
Figure 1C:
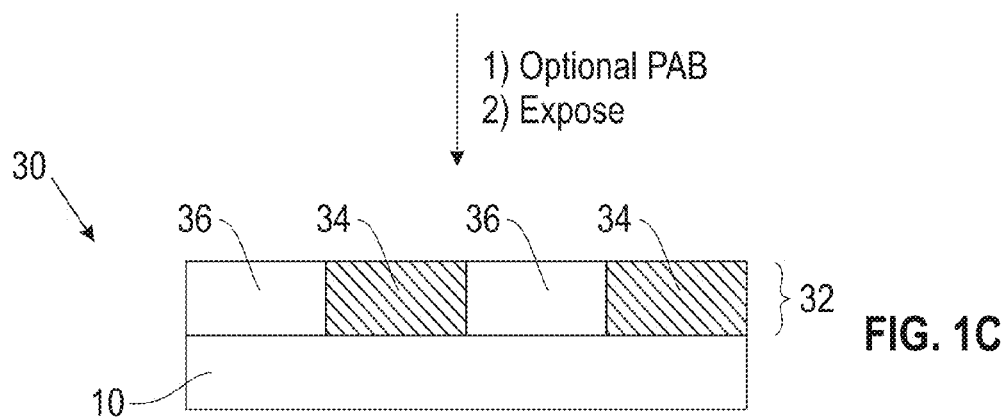
Figure 1D:
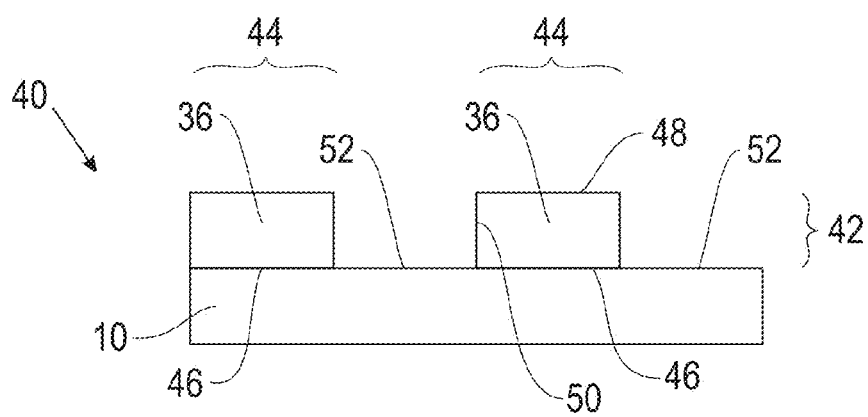
Figure 1E:
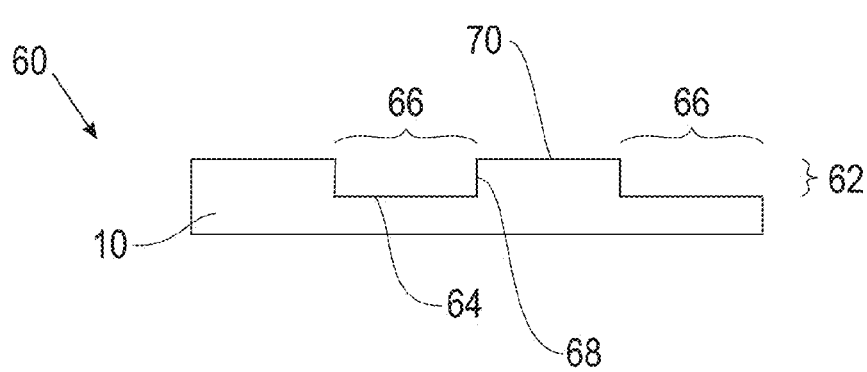

The present invention encompasses a method of patterning a desired substrate, such as, for example, a silicon wafer, a chrome-on-glass mask blank, or a printed circuit board. The method includes applying to the substrate a photoresist composition containing a PAG polymer to form a photoresist film layer. The schematic layer diagrams of FIGS. 1A to 1E illustrate a method of forming a lithographically patterned layered structure utilizing a photoresist composition comprising at least a PAG polymer and a solvent. The photoresist composition is disposed on surface 12 of substrate 10 (FIG. 1A) followed by removal of the solvent to form photoresist layer 22 of structure 20 (FIG. 1B). Photoresist layer 22 can be treated with an optional post-application bake (PAB) and/or an optional solvent rinse under suitable conditions of time and temperature before exposure. Pattern-wise exposure of photoresist layer 22 is performed preferably using EUV and/or e-beam, resulting in exposed photoresist layer 32 of structure 30 (FIG. 1C). Photoresist layer 32 is composed of regions of exposed photoresist 34 and regions of non-exposed photoresist 36. Photoresist layer 32 can be treated with an optional post-exposure bake (PEB) and/or an optional solvent rinse under suitable conditions of time and temperature before development. The exposed photoresist 34 has greater solubility in an aqueous developer compared to non-exposed photoresist 36. Consequently, aqueous development affords a positive-tone image by removing regions of exposed photoresist 36. The PAB, PEB and/or solvent rinse(s) can enhance solubility differences of the exposed and non-exposed photoresist in a given developer. Development in an aqueous developer produces layered structure 40 comprising patterned photoresist layer 42 (FIG. 1D). Patterned photoresist layer 42 is a topographical relief pattern comprising photoresist features 44 composed of non-exposed photoresist 34. Photoresist features 44 are disposed on surface 46 of substrate 10 and have top surface 48 and sidewall 50. Substrate surface 52 is in contact with air. The topographical relief pattern of patterned photoresist layer 42 can be transferred to substrate 10 by known methods followed by removal of photoresist features 44 (e.g., oxygen ion etching), resulting in structure 60 (FIG. 1E). Structure 60 comprises a transferred topographical pattern 62 within substrate 10, whose features 66 comprise bottom surface 64, sidewall surface 68, and top surface 70 of substrate 10.

The photoresist layer can be rinsed before or after the exposure, the PAB, and/or the PEB with a solvent (e.g., water, aqueous solutions, including water/alcohol mixtures, and organic solvents). Typically, the rinse is performed after the PAB. Rinses can be performed at or near room temperature (e.g., 10° C. to 50° C.) for a period of 1 second to 1 hour.

Optionally, the pre-developed photoresist layer and/or post-developed photoresist layer can be treated with water vapor and/or alcohol vapor either at room temperature or at elevated temperature on a time scale of 1 minute to 5 hours. Such a treatment after exposure and PEB can be conducted, for example, to promote additional acid induced deprotection of acid sensitive groups.

The term "substrate" refers to all underlying layers of a structure on which the photoresist layer is disposed. The substrate can have one or more layers arranged in a stack. In a multi-layered substrate, the layer directly below and in contact with the photoresist layer is the top-most layer of the substrate, also referred to as "the underlayer" to the photoresist layer. The terms "surface" or "underlying surface" refer, unless otherwise stated, to the substrate surface on which the photoresist layer is disposed. As non-limiting examples, the photoresist layer can be disposed on the surface of a silicon wafer or a metal foil, or more particularly on the surface of an anti-reflection layer (ARC) of a multi-layer substrate, where the ARC layer is the top-most layer. In this example, the ARC layer is also the underlayer of the photoresist layer. In another example, the ARC layer has a polymer brush layer attached to the top surface. In this example, the polymer brush layer is also the underlayer of the photoresist layer.

The term "disposed" refers to a layer in contact with a surface of another layer. "Disposing" or "applying" refer to forming a layer to be in contact with a surface of another layer, without limitation as to the method employed unless otherwise stated, providing the desirable properties of the disposed or applied layer are not adversely affected (e.g., uniformity and thickness).

The term "casting" refers to forming a layer of a material by disposing a solution of the material dissolved in a solvent on a surface of another layer, and removing the solvent.

Herein, a "positive-tone" photoresist is a photoresist that becomes more soluble in a given developer when exposed to a radiation, typically by a non-crosslinking chemical reaction induced by the exposure. The photoresist compositions herein are positive-tone. A "negative-tone" photoresist becomes less soluble in a given developer when exposed to a radiation, typically due to a crosslinking reaction or some other chemical change induced by the exposure, which lowers the solubility of the photoresist in the developer.

"Negative-tone development" means the non-exposed areas of the photoresist layer are removed during development. "Positive-tone development" means the exposed areas of the photoresist layer are removed during development.

It is understood that in some cases (e.g., when forming dense, high resolution patterns) all of the photoresist layer can receive some dose of radiation exposure. "Non-exposed photoresist" refers to photoresist that has received insufficient dose to switch the solubility of the photoresist in a given developer compared to the pre-exposed photoresist, including pre-exposed photoresist that has been treated with an optional bake and/or optional rinse. "Exposed photoresist" has received sufficient exposure to switch the solubility of the photoresist in a given developer compared to the pre-exposed photoresist.

When referring to the chemical components, reactivity, solubility and/or surface properties of the photoresist layer, it is understood that such reference is directed only to the photoresist layer and not to the substrate or the substrate surface, unless otherwise stated. Likewise, when referring to the chemical components, chemical reactivity, solubility and/or surface properties of the substrate surface or substrate layers, such reference is directed only to the substrate surface or substrate layer(s) and not to the photoresist layer, unless otherwise stated.

The optional baking (PAB and/or PEB) treatments and/or optional rinsing treatments can enhance the solubility difference of the exposed photoresist compared to the non-exposed photoresist. A PAB and/or PEB can be used to facilitate deprotection of acid sensitive protecting groups and/or elimination of reaction byproducts of the photoresist composition.

The optional post-application bake (PAB) treatment is typically performed at a temperature of 50° C. to 250° C. for a period of 1 second to 10 minutes. The PAB can be used to dry the film of excess solvent, remove unwanted or excess organic ligand, and/or partially crosslink the photoresist layer. The thermally treated dry film typically will have a thickness of 0.01 micrometers to 10 micrometers, depending on the subsequent radiation source and the desired application.

The optional post-exposure bake (PEB) can be performed at a temperature of 50° C. to 300° C. for 1 second to 10 minutes.

"Polarity change" implies an altered chemical composition that affects relative solubility without crosslinking. The extent of the polarity change can be measured by comparing the solubility of the exposed photoresist and non-exposed photoresist in a given developer. "Inducing a polarity change" in the photoresist layer means subjecting the photoresist layer to a treatment involving exposure, a post-exposure bake (PEB) and/or an optional rinse that alters the chemical composition of the layer such that the treated photoresist has a different solubility in a given developer compared to the pre-treated photoresist.

The patterned photoresist layer can also be given a post-development treatment, for example, to increase etch resistance. The post-development treatment can be photochemical, thermal, chemical, or a combination thereof. As an example, the patterned photoresist layer can be given a second exposure to a second radiation, thereby forming a treated patterned photoresist layer. The second exposure can be performed with a single wavelength of second radiation or a combination of suitable wavelengths (broad band) of second radiation, so long as the exposure is effective in inducing the desired response of the treated patterned photoresist layer. The second exposure treatment can be a flood exposure. The flood exposure can be a single conventional whole area exposure or a combination of conventional whole area exposures. The exposure treatment can also be a scanning exposure delivered by digital writing device employing light emitting sources. The second exposure can be followed by a thermal treatment to chemically amplify the formation of chemical functional groups in the treated patterned photoresist layer. For example, the flood exposure can release an acid from previously unreacted photoacid generator (PAG) that upon subsequent heating catalyzes the deprotection of additional acid-sensitive carboxylic acid esters, aromatic acetals/ketals, and/or carbonates, thereby increasing the concentration of carboxylic acid and phenol groups in the treated patterned photoresist layer. With sufficient polarity change, the treated patterned photoresist layer can be rendered insoluble in either a low polarity solvent (e.g., anisole) or a more polar organic solvent, while retaining solubility in aqueous alkaline developer and/or a second organic solvent, without crosslinking the photoresist.

A post-development thermal treatment can further tailor the solvent compatibility, chemical structure of the photoresist material, and/or etch resistance of the patterned photoresist layer. The thermal treatment can be conducted at a temperature of 50° C. to 600° C., 50° C. to 300° C., or 50° C. to 200° C. for a period of 1 sec to 1 day.

A chemical treatment can include, for example, contacting the patterned photoresist layer with the vapors of a volatile Lewis acid, such as hydrochloric acid, sulfuric acid, nitric acid, or a sulfonic acid. In each type of treatment, the chemical alteration of the photoresist is preferentially uniformly distributed throughout the treated photoresist, not just at the surface. The post-development chemical treatment can cause a chemical change in the revealed surface of the substrate, producing after removal of the photoresist features a chemically patterned surface of the substrate.

Etching includes any common etching technique applied in the manufacture of semiconductor devices, for example, dry-etching such as plasma etching, or wet-etching using selective solvents. Typically, dry etching processes are employed for etching at sub-50 nm dimensions.

The substrate, and more particularly the surface of the substrate, can comprise inorganic or organic materials such as metals, carbon, or polymers. More particularly, the substrate can comprise any semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si) such as, for example, silicon dioxide, silicon nitride, and quartz. The semiconductor material can be doped, undoped or contain both doped and undoped regions therein.

Figure 2:
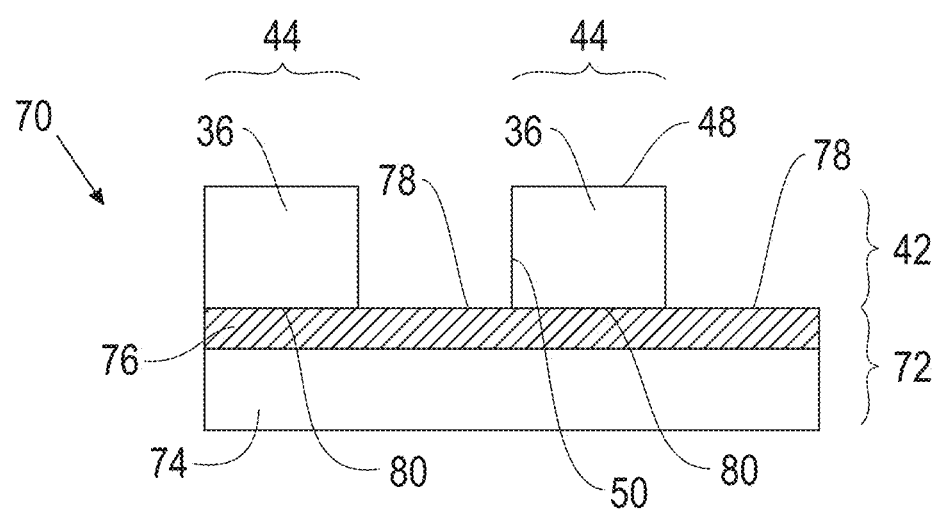
FIG. 2 is a schematic layer diagram of multi-layered structure that includes a topographical patterned layer comprising exposed photoresist composition disposed on a two layered substrate.

To further illustrate a multi-layered substrate, structure 40 of FIG. 1D is reproduced in structure 70 of FIG. 2, with the exception that substrate 72 of FIG. 2 has two layers, a bottom layer 74 and an intermediate layer 76. Bottom layer 74 of substrate 72 can be, for example, a silicon wafer. Intermediate layer 76 can be, for example, an ARC layer. In this example, surface 78 is a surface of the ARC layer in contact with air, and photoresist features 44 are disposed on ARC surface 80.

Photoresist Compositions.

The photoresist composition comprises a PAG polymer, a solvent, and optionally selected additives that do not adversely affect the desirable properties of the photoresist layer, such as developability and/or etch resistance. Exemplary optional additives include photo-acid generators other than the PAG polymer, dissolution inhibitors, thermal acid generators, acid amplifiers, photobase generators, thermal base generators, photo-destructible bases, surfactants, base quenchers, sensitizers, polymers, dyes, stabilizers, cross-linking agents, dissolution accelerators, adhesion promoters, defoaming agents, and combinations of the foregoing additives. Once all components are dissolved and distributed in the solution, the solution is filtered and optionally treated with, for example, ion exchanging media, so as to remove undesired components such as trace acids, bases or metals.

Exemplary solvents for casting the photoresist composition include organic solvents, water, and aqueous organic solvent mixtures. Organic solvents include alcohols, ethers, glycol ethers, alkylene glycol monoalkyl esters, aromatic hydrocarbons, ketones, esters, and combinations thereof. Specific exemplary casting solvents include carbon dioxide, ethyl lactate, butyl acetate, 2-ethoxyethanol, gamma-butyrolactone, cyclopentanone, cyclohexanone, methyl cellosolve, ethoxyethylpropionate (EEP), a combination of EEP and gamma-butyrolactone (GBL), propylene glycol methyl ether acetate (PGMEA), and mixtures thereof.

The photoresist composition can include a photosensitive acid generator (PAG) other than PAG polymer. Examples of photochemical acid generators (PAGs) include, but are not limited to, sulfonates, onium salts, aromatic diazonium salts, sulfonium salts, diaryliodonium salts, sulfonic acid esters of N-hydroxyamides, sulfonic acid esters of N-hydroxyimides, and combinations thereof.

Typical photoacid generators include, without limitation:
i) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;
ii) halonium salts, particularly iodonium salts, including diphenyliodonium perfluoromethanesulfonate(diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;
iii) alpha,alpha'-bis-sulfonyl-diazomethanes such as bis (p-toluenesulfonyl)diazomethane, methylsulfonyl p-toluenesulfonyldiazomethane, 1-cyclohexylsulfonyl-1-(1,1-dimethylethysulfonyl)diazomethane, and bis (cyclohexylsulfonyl)diazomethane;
iv) trifluoromethanesulfonate esters of imides and hydroxyimides (e.g., alpha-methylsulfonyloxy)-bicyclo[2.2.1]hept-5-ene-2,3-dicarboximide (MDT);
v) nitrobenzyl sulfonate esters such as 2-nitrobenzyl p-toluenesulfonate, 2,6-dinitribenzyl p-toluenesulfonate, and 2,4-dinitrobenzyl p-trifluoromethylbenzene sulfonate;
vi) sulfonyloxynaphthalimides such as N-camphorsulfonyloxynaphthalimide and N-pentafluorophenylsulfonyloxynaphthalimide;
vii) pyrogallol derivatives (e.g., trimesylate of pyrogallol);
viii) naphthoquinone-4-diazides;
ix) alkyl disulfones;
x) s-triazine derivatives; and
xi) miscellaneous sulfonic acid generators including t-butylphenyl-alpha-(p-toluenesulfonyloxy)-acetate, t-butyl-alpha-(p-toluenesulfonyloxy)acetate, and N-hydroxy-naphthalimide dodecane sulfonate (DDSN), and benzoin tosylate.

Preferred dissolution inhibitors have high solubility in the photoresist composition and in the solvent used to prepare solutions of the photoresist composition (e.g., water, alcohols, other organic solvent such as propylene glycol methyl ether acetate (PGMEA)), exhibit strong dissolution inhibition, have a high exposed dissolution rate, are substantially transparent at the wavelength of interest, can exhibit strong etch resistance, and display good thermal stability (i.e., stability at temperatures of about 140° C. or greater). Dissolution inhibitors include, but are not limited to:
i) bisphenol A derivatives wherein one or both hydroxyl moieties are converted to a t-butoxy substituent or a derivative thereof such as a t-butoxycarbonyl or t-butoxycarbonylmethyl group;
ii) fluorinated bisphenol A derivatives such as 2,2-bis(4-hydroxy-phenyl)-1,1,1,3,3,3-hexafluoropropane protected with t-butoxycarbonylmethyl groups;
iii) compounds comprising normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups;

iv) compounds comprising cyclic acetal groups such as tetrahydrofuranyl, tetrahydropyranyl, and 2-methoxytetrahydro-pyranyl groups;

v) androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and hydroxyl-substituted analogs of the foregoing compounds; and vi) androstane-17-alkylcarboxylates substituted with one to three $C_1C_4$ fluoroalkyl carbonyloxy substituents, such as t-butyl trifluoroacetyllithocholate.

A thermal acid generator (TAG) is capable of releasing or generating acid upon heating. Exemplary thermal acid generators include diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts, and sulfonic ester compounds such as cyclohexyl p-toluenesulfonate, cyclohexyl propanesulfonate, cyclohexyl methanesulfonate, cyclohexyl octanesulfonate, cyclohexyl camphorsulfonate, and combinations thereof.

An acid amplifier is a compound that is decomposed with an acid to generate an acid. Non-limiting examples of acid amplifiers include tert-butyl-2-methyl-2-tosyloxymethyl acetoacetate and 2-phenyl-2-(2-tosyloxyethyl)-1,3-dioxolane. Of well-known photoacid generators, many of those compounds having poor stability, especially poor thermal stability, and exhibit an acid amplifier-like behavior.

A photobase generator (PBG) generates a base upon exposure to radiation. Photobase generators include quaternary ammonium dithiocarbamates, alpha aminoketones, oxime-urethane containing molecules such as dibenzophenoneoxime hexamethylene diurethane, ammonium tetraorganylborate salts, N-(2-nitrobenzyloxycarbonyl)cyclic amines, and combinations thereof.

A photo-destructible base (PDB) is a base that by exposure to radiation is converted into a species that does not interfere with an acid. For example, triphenylsulfonium hydroxide (TPSH), upon exposure, is converted into water and neutral organic species.

A thermal base generator (TBG) forms a base upon heating above a first temperature, T. T can be a temperature of about 140° C. or greater, such as 140° C. to 260° C. The thermal base generator can comprise a functional group selected from the group consisting of amide, sulfonamide, imide, imine, O-acyl oxime, benzoyloxycarbonyl derivative, quaternary ammonium salt, nifedipine, carbamate, and combinations thereof. Exemplary thermal base generators include o-{(.beta.-(dimethylamino)ethyl)amino carbonyl}benzoic acid, o-{(.gamma.-(dimethylamino)propyl)amino carbonyl}benzoic acid, 2,5-bis{(.beta.-(dimethylamino)ethyl)aminocarbonyl}terephthalic acid, 2,5-bis{(.gamma.-(dimethylamino)propyl)aminocarbonyl}terephthalic acid, 2,4-bis{(.beta.-(dimethylamino)ethyl)aminocarbonyl}isophthalic acid, 2,4-bis{(.gamma.-(dimethylamino)propyl)aminocarbonyl}isophthalic acid, and combinations thereof.

The photoresist composition can comprise a surfactant. Surfactants can be used to improve coating uniformity, and can include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Dow Chemical.

Exemplary base quenchers comprise aliphatic amines, aromatic amines, carboxylates, hydroxides, or combinations thereof. For example, base quenchers can include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE, a trademark of by Sigma Aldrich), berberine, or polymeric amines. Tetraalkyl ammonium hydroxides or cetyltrimethyl ammonium hydroxide can be used as a base quencher when the PAG is an onium salt.

Sensitizers include polycyclic aromatics such as pyrene, perylene, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl) ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, and combinations thereof.

Dyes can be used, for example, to adjust the optical density of the photoresist composition in order to enhance the activity of photoacid generators by absorbing radiation and transferring the absorbed energy to the photoacid generator. Exemplary dyes include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing aromatics.

Additive polymers and/or oligomers can provide, for example, an increase in certain properties, such as increased transparency at a predetermined desired wavelength, increased dry etch resistance, and/or increased solubility in aqueous base developer. Polymers include acrylates, methacrylates, cycloolefin polymers, cycloolefin maleic anhydride copolymers, cycloolefin vinyl ether copolymers, siloxanes, silsesquioxanes, and carbosilanes. Oligomers include polyhedral oligomeric silsesquioxanes, carbohydrates, and other cage compounds. These polymers and/or oligomers can be appropriately functionalized with aqueous base soluble groups, acid-sensitive groups, polar functionalities, and/or silicon-containing groups as needed. Polymers that are non-fluorine-containing or fluorine-containing can be used. Exemplary fluorine-containing polymers include those prepared from monomers bearing a fluoroalcohol group, such as NBHFA (bicyclo[2.2.1]hept-5-ene-2-(1,1,1-trifluoro-2-trifluoromethylpropan-2-ol). These polymers can be NBHFA homopolymers ("PNBHFA") or copolymers of NBHFA with other monomers, including, without limitation, other norbornene monomers.

A wide variety of compounds with varying basicity can be used as stabilizers and acid-diffusion controlling additives. These can include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts can also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like can also be employed.

The photoresist composition can comprise a PAG polymer in an amount of about 1 wt % to about 30 wt % (weight percent), more particularly about 2 wt % to about 15 wt %, based on the total weight of the photoresist composition excluding solvents (i.e., total solids weight of the photoresist composition).

The photoresist composition can comprise a photoacid generator other than the PAG polymer in an amount of about 0.5 wt % to about 20 wt %, more particularly about 0.5 wt % to about 10 wt % of based on the total solids weight of the photoresist composition.

The photoresist composition can comprise a dissolution inhibitor in an amount of about 1 wt % to about 40 wt %, preferably about 5 wt % to 30 wt %, based on the total solids weight of the photoresist composition.

The photoresist composition can comprise a thermal acid generator in an amount of about 0.01 wt % to about 20 wt %, more particularly from about 0.1 wt % to about 10 wt %, based on the total solids weight of the photoresist composition.

The photoresist composition can comprise an acid amplifier in an amount of about 0.01 wt % to about 20 wt %, more particularly from about 0.1 wt % to about 10 wt % based on the total solids weight of the photoresist composition.

The photoresist composition can comprise a photobase generator in an amount of about 0.01 wt % to about 20 wt %, more particularly from about 0.1 wt % to about 10 wt % based on the total solids weight of the photoresist composition.

The photoresist composition can comprise a thermal base generator in an amount of about 0.01 wt % to about 20 wt %, more particularly from about 0.1 wt % to about 10 wt % based on the total solids weight of the photoresist composition.

The photoresist composition can comprise a photo-destructible base in an amount of about 0.01 wt % to about 20 wt %, more particularly from about 0.1 wt % to about 10 wt % based on the total solids weight of the photoresist composition.

The photoresist composition can include surfactant in an amount of about 0.001 wt % to about 0.1 wt % based on the total weight of the photoresist composition.

The photoresist composition can comprise solvent in an amount of about 70 wt % to about 99 wt %, more particularly from about 85 wt % to about 98 wt % of the based on the total weight of the photoresist composition.

The photoresist composition can include a base quencher in an amount of about 0.1 wt % to about 1.0 wt % of based on the total solids weight of the photoresist composition.

The photoresist composition can comprise sensitizer in an amount of about 0.1 wt % to about 30 wt %, more particularly from about 0.1 wt % to about 20 wt % based on the total solids weight of the photoresist composition.

The photoresist composition can comprise a stabilizer in an amount of about 0.1 wt % to about 30 wt %, more particularly from about 0.1 wt % to about 20 wt % based on the total weight of the photoresist composition.

Typically, the sum of all customary optional additives (other than the PAG polymer) 0 wt % to less than 20 wt %, preferably 0 wt % to less than 10 wt %, more preferably 0 wt % to less than 5 wt %, and most preferably 0 wt % to less than 1 wt %, based on the total weight of the solids of the photoresist composition.

The photoresist compositions are particularly useful as radiation sensitive photoresists employed in the manufacture of electronic parts, especially semiconductor devices, or in the manufacture of photolithography masks using optical, electron beam, ion beam or x-ray radiation. Moreover, the compositions of the present invention can be employed for patterning printed circuit boards or photolithographic masks (i.e., photomasks), micromachining, the fabrication of microfluidic cells, or other related practices that require the definition of high resolution patterns.

The photoresist layer can be formed by processes such as spin coating (also referred to as spin casting), spray coating, dip coating, doctor blading, roll coating, and the like, which can be used individually or in combinations thereof in accordance with the methods of the present invention. More particularly, a solution comprising the PAG polymer in a suitable solvent is spin coated onto the surface of the substrate, followed by removal of the solvent to produce the photoresist layer.

Pre-application, post-application, post-exposure, and post-development processes such as, for example, application of an anti-reflective coating, substrate priming, baking, flood exposure, or vapor treatment, can also be incorporated into the methodologies of the invention at least in part to enhance the performance and/or advantages of the present invention, as is known in the art.

In particular, the incorporation of a post-application bake (PAB) to remove residual casting solvent of the photoresist film is highly desirable. The post-application bake (PAB) can be performed at a temperature of 50° C. to 300° C., more particularly 50° C. to 250° C., for a period of 1 sec to 1 hour, and more particularly 1 sec to 10 minutes. In an embodiment, the photoresist layer is treated with a PAB process at a temperature of about 80° C. to about 130° C. for a period of about 10 seconds to about 120 seconds.

In general, the photoresist layer can have a thickness of 100 to 100000 angstroms (0.01 to 10 micrometers), more particularly 200 to 5000 angstroms, and even more particularly 200 to 3000 angstroms.

The components of the photoresist layer, which include the PAG polymer and any optional additives after removal of the solvent, which are subjected imagewise to a radiation exposure, are collectively referred to herein as "photoresist".

Pattern-wise exposure of the photoresist layer can be accomplished using radiation of various types, including ultraviolet (UV) radiation of wavelengths from 450 nm to 300 nm, deep ultraviolet (DUV) radiation of wavelengths from 300 nm to 120 nm, extreme ultraviolet (EUV) radiation of wavelengths from 120 nm to 8 nm, electron-beam (e-beam) radiation, x-ray radiation, combinations of the foregoing, and other suitable sources. Examples include 193 nm ArF excimer source, an EUV source, or an electron beam. DUV and EUV exposures employ a specific mask to generate patterns in the negative-tone photoresist layer. E-beam lithography writes patterns directly to the photoresist. Exemplary radiation sources include single wavelength and/or narrow band radiation sources, Sn plasma sources for EUV, specific mercury emission lines, lasers, and particle beam emitters. For less stringent conditions, a broad band multiple wavelength source can be used. More particularly, the radiation wavelength is selected from the group consisting of 436 nm, 405 nm, 365 nm, 334 nm, 313 nm, 257 nm, 248 nm, 193 nm, 157 nm, 126 nm, and 13.5 nm. Even more particularly, the wavelength of the radiation is selected from the group consisting of 248 nm, 193 nm, 157 nm, and 13.5 nm. Still more specifically, the wavelength of the radiation for the pattern-wise exposure can be 193 nm or 13.5 nm.

The pattern-wise exposure can be performed either dry or under immersion conditions, particularly immersion conditions utilizing a high index of refraction fluid between the lens element and the wafer. Immersion fluids include water and other high index fluids such as decane, and various fluorinated solvents. More specifically, the pattern-wise exposure can be accomplished by 193 nm water-immersion lithography. In order to accommodate patterning by 193 nm water-immersion lithography, a protective topcoat layer can be applied to the surface of the photoresist prior to exposure via immersion lithography. For example, silation or another suitable technique can be used to modify the wetting properties of the film with respect to the immersion fluid. Preferably, the topcoat layer is base-soluble and is removed during the photoresist development step by the alkaline photoresist developer. Alternatively, the photoresist can comprise surface-active components that control the surface properties of the coated photoresist and limit the extraction of photoresist components into the immersion fluid.

Additionally, it can be desirable to include a post-exposure bake (PEB) in a manner consistent with the PAB methodology described above. Although it is not necessary for performance of many low activation energy chemically amplified photoresists, a PEB can be included to enhance lithographic imaging quality. A PEB process can include baking the wafer or substrate at a temperature of about 80° C. to about 140° C. for a period of about 10 seconds to about 120 seconds. It is to be appreciated that both PAB and PEB processes can be accomplished using conventional methods understood by those skilled in the art, such as, for example, contact hot plate baking, oven baking, and/or proximity baking. It may also be desirable to incorporate prior treatment of the substrate with a surface priming agent including, but not limited to, conventional silylating agents such as, for example, hexamethyldisilazane and/or related species by techniques known to those skilled in the art. Illustrative techniques suitable for use with the present invention include, without limitation, vapor priming and liquid puddle application.

The imagewise exposed and optionally post-exposure baked photoresist layer can be developed by, for example, immersion, puddle development, or other processes known to those skilled in the art. Developer solution can include, for example, dilute aqueous alkali solution, which may or may not contain a surfactant. A patterned photoresist layer is formed by selectively removing the exposed photoresist with the developer. The patterned photoresist layer is disposed on a first surface of the substrate. A second surface of the substrate can have substantially no residual photoresist disposed thereon, or no residual photoresist disposed thereon.

The developer can comprise an organic solvent. Exemplary organic solvents include anisole, ethylene glycol, propylene glycol, and 4-methyl-2-pentanol, n-butyl acetate, and mixtures thereof. The developer can also include a supercritical fluid, such as liquefied methane, liquefied ethane, liquefied propane, or liquefied carbon dioxide. The non-alkaline developer comprising supercritical fluids can further comprise additional components including organic solvents, surfactants, and salts in order to modify various properties of the developer. In the case of positive-tone photoresists, the exposed areas of the film will be rendered soluble in the developer and can be washed away, leaving a topographical pattern of features comprising non-exposed portions of the photoresist layer. In negative-tone photoresists, the exposed areas of the film will be rendered insoluble and will remain after development of the non-exposed areas. The developed image can then be rinsed with water to remove excess developer and dried.

A photoresist feature of the patterned photoresist layer can have a height of 10 to 10000 angstroms, more particularly 100 to 3000 angstroms, and more particularly 500 to 1500 angstroms.

The wafers can be reworked if necessary. Reworking a wafer can occur, for example, when post-development inspection detects unacceptable defects (e.g., misalignment) in the photoresist pattern. The wafer can be solvent stripped to remove the photoresist before the wafer is etched or otherwise irreversibly altered. The wafer can then be resubmitted to the photoresist pattern generating process.

The patterned photoresist layer can then be used as an etch mask for subsequent image transfer into the underlying substrate. Etching the patterned substrate can be accomplished using a conventional etching process that may include, but is not limited to, a reactive ion etch. In addition, any remaining photoresist composition can be removed from the substrate, for example, using a stripping agent.

Also disclosed are the layered structures formed using the above-described methods. In one embodiment, the layered structure is a semiconductor device. The semiconductor device comprises a substrate comprising an anti-reflection surface; and a developed patterned photoresist layer comprising radiation exposed photoresist disposed on a first area of the anti-reflection surface. The patterned photoresist layer can be in the form of a topographical relief pattern comprising, for example, a pattern of openings derived by selective removal of non-exposed photoresist.

In the manufacture of integrated circuits, circuit patterns can be formed in the exposed areas after photoresist development by coating the patterned substrate with a conductive material, e.g., a metallic material, using known techniques such as evaporation, sputtering, plating, chemical vapor deposition, or laser-induced deposition. Dielectric materials can be deposited by similar means during the process of making circuits. Inorganic ions such as boron, phosphorous, or arsenic can be implanted in the substrate in the process for making p-doped or n-doped circuit transistors. It should be understood that the invention is not limited to any specific lithographic technique or device structure.

The above-described PAG polymer and methods permit a photoresist feature width of from 1 to 1000 nm, from 1 to 500 nm, from 1 to 300 nm, from 1 to 200 nm, from 1 to 150 nm, or more particularly from 1 to 100 nm. A line/space pattern of less than 22 nm can be achieved.

The following examples are provided to illustrate the scope and spirit of the present invention. Because these examples are given for illustrative purposes only, the invention embodied therein should not be limited thereto.

EXAMPLES

Materials used in the following examples are listed in Table 1.

TABLE 1

| ABBREVIATION | DESCRIPTION | SUPPLIER |
|---|---|---|
| | Dodecanethiol | Sigma-Aldrich |
| AIBN | Azobisisobutyronitrile | Sigma-Aldrich |
| TPSHDS | Triphenylsulfonium 2-Hydroxy-1,1-Difluoroethanesulfonate | |
| EIMA | 2-Methacryloxyethyl Isocyanate | Sigma-Aldrich |
| NbHFAMA | 2-{[5-(1',1',1'-trifluoro-2'-trifluoromethyl-2'-hydroxy)propyl]norbornyl]}methacrylate | |
| NbNHCF3SO2MA | 5-[(Trifluoromethylsulfonylamino)Methyl]-2-Norbornyl Methacrylate | Central Glass Co. Ltd, Japan |
| SOH | Hydroxystyrene; MW 120.2 | |
| DMAP | Dimethylamino Pyridine | Sigma-Aldrich |
| TPS-UMA | Triphenylsulfonium 2-((2-Methacryloyloxy)Ethylcarbamoyloxy)-1,1-Difluoroethanesulfonate; MW 579.1 | |
| NLM | 5-Methacryloxy-2,6-Norbornanecarbolactone | |
| ECPMA | 1-Ethylcyclopentyl Methacrylate | Osaka Organic Chemical Industry Limited, Japan |
| MCPMA | 1-Methylcyclopentyl Methacrylate | |
| ECOMA | 1-Ethylcyclooctyl Methacrylate | |
| MAdMA | 2-Methyl-2-Adamantyl Methacrylate | ChemOrganic Limited, China. |
| EAdMA | 2-Ethyl-2-Adamantyl Methacrylate | ChemOrganic Limited, China. |
| TBMA | t-Butyl Methacrylate | Sigma-Aldrich |
| | 4-Acetoxystyrene | Dupont Electronic Technologies |

Herein, Mn is the number average molecular weight, Mw is the weight average molecular weight, and MW is the molecular weight of one molecule.

The preparation of triphenylsulfonium 2-hydroxy-1,1-difluoroethanesulfonate (TPSHDS) is described in US20110319652 A1 to Jodry et al. The preparation of 1-methylcyclopentyl methacrylate (MCPMA) is described in U.S. Pat. No. 6,136,501 to Trefonas III et al.

The preparation of 1-ethylcyclooctyl methacrylate (ECOMA) is described in US20110008727 A1 to Allen et al.

2-Methyl-2-adamantyl methacrylate (MAdMA) and 2-ethyl-2-adamantyl methacrylate (EAdMA) are commercially available from ChemOrganic Limited, China.

The preparation of 2-{[5-(1',1',1'-trifluoro-2'-trifluoromethyl-2'-hydroxy)propyl]norbornyl]}) methacrylate (Nb-HFAMA) is described in U.S. Pat. No. 7,014,980 to Allen et al.

The preparation of 5-methacryloxy-2,6-norbornanecarbolactone (NLM) is described in U.S. Pat. No. 7,378,683 to Endoh et al. NLM is also commercially available from Kuraray Fine Chemicals, Japan.

Preparation of hydroxy styrene monomer (SOH) in tetrahydrofuran.

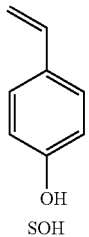

SOH

A 3 liter round bottom flask was equipped with a mechanical overhead stirrer, thermocouple thermometer, and an addition funnel equipped with a nitrogen gas inlet. The flask was charged with 4-acetoxy styrene (454 g, 2.8 mol) and 1820 grams tetrahydrofuran (THF). The addition funnel was charged with 240 mL of 12 molar aqueous ammonium hydroxide (approximately 3.5 mol). The flask was nitrogen flushed and kept under a nitrogen blanket as the ammonium hydroxide was added to the rapidly stirred solution over 30 minutes. A slight exotherm of about 10° C. was observed. The mixture was allowed to stir at room temperature overnight. The reaction mixture was transferred to a 6 liter reparatory funnel and washed with one 2 liter portion of brine followed by four 1 liter brine extractions. The THF solution was dried by stirring overnight with 50 grams of anhydrous magnesium sulfate. After removing the magnesium sulfate the by filtration the solution was concentrated on the rotary evaporator using house vacuum and a bath temperature of 30° C. The concentrated solution (555 grams) contained 49.3 mole % 4-hydroxystyrene (81% yield) and 50.7 mole % of tetrahydrofuran by NMR analysis. Additional tetrahydrofuran was added to obtain a solution containing 23-26 mole % 4-Hydroxystyrene as determined by NMR analysis.

Preparation of PAG monomer, triphenylsulfonium 2-((2-methacryloyloxy)ethylcarbamoyloxy)-1,1-difluoroethanesulfonate (TPS-UMA):

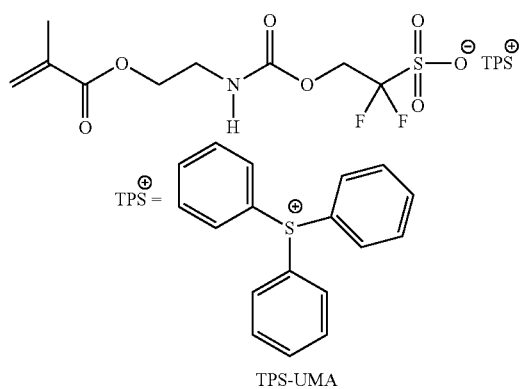

Triphenyl sulfonium 2-hydroxy-1,1-difluoroethanesulfonate (TPSHDS) (131 g, 0.284 mol), a catalytic amount of dimethylamino pyridine (DMAP) (about 0.025 g), and 2-methacryloxyethyl isocyanate (EIMA) (40 g, 0.256 mol) were mixed in acetonitrile (400 mL) and heated for 10 hours at 45° C. The solvent was evaporated and then, the desired material was extracted from $CHCl_3$/water solution. The $CHCl_3$ solution mixture was washed with ether. The desired material was obtained as $CHCl_3$ solution (129 g solution, 77.5 g solid, 52% yield). $^1$H NMR ($CDCl_3$); delta=7.76-7.63 (m, 15H; $Ph_3S^+$), 6.07 (s, 1H; =$CH_2$), 5.53 (t, J=1.6 Hz, 2H; =$CH_2$), 5.38 (s, 1H; NH), 4.72 (t, J=15.0 Hz, 2H; $CF_2CH_2$), 4.16 (t, J=5.4 Hz, 2H; $OCH_2$), 3.44 (q, J=5.3 Hz, 2H; $NHCH_2$), 1.88 (t, J=1.1 Hz, 3H; $CH_3$). $^{19}$F NMR ($CDCl_3$, $CFCl_3$ as standard); delta=−114.3 (t, J=16.0 Hz, 2F).

The following general procedure was used to prepare PAG copolymers comprising TPS-UMA by free radical polymerization. A 25 weight percent solution of the desired monomers in methyl ethyl ketone was deoxygenated with nitrogen, then heated to reflux for several minutes. The mixture was cooled below the reflux temperature and 2 mole percent of dodecanethiol along with 4 mole percent of azobisobutyronitrile (AIBN) were added, based on total moles of monomers. After flushing the reaction vessel with nitrogen the mixture was heated to reflux under a nitrogen blanket for 19 hours. The reaction mixture was cooled to room temperature and added to a 40-fold excess of stirred hexanes. The precipitated polymer was collected by filtration, washed with several portions of hexane, and dried in a vacuum oven. The dried polymer was dissolved in a small amount of acetone and precipitated into a 50 fold excess of deionized water. This process was repeated an additional two times. The filtered polymer was dried in a vacuum oven to constant weight.

Examples 1 to 6

PAG polymers prepared by free radical polymerization using NbHFAMA, TPS-UMA, and an acid sensitive comonomer according to the following reaction.

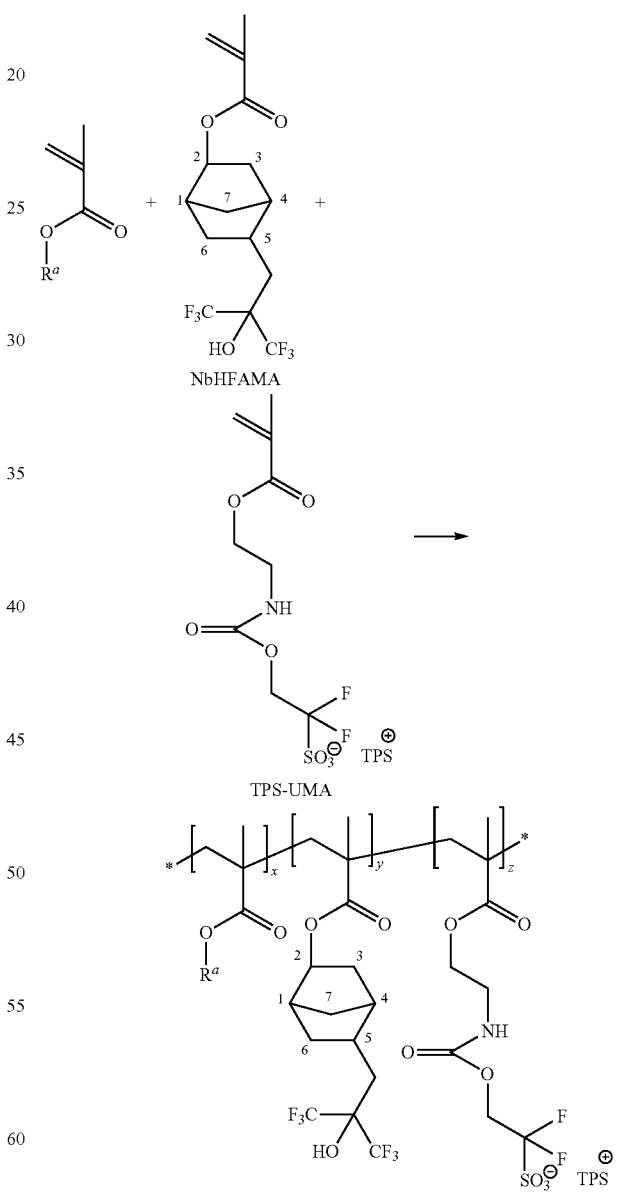

Example 1: with TBMA, $R^a$=t-Butyl, x=40, y=55, z=5; GPC (versus polystyrene standards) Mn 3431; Mw 4269; Tg 141.15° C.

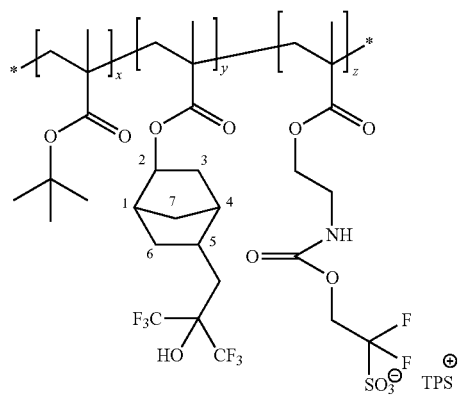

Example 2: with ECOMA, $R^a$=1-ethyl cyclooctyl, x=40, y=55, z=5; GPC (versus polystyrene standards) Mn 3116: Mw 4121: Tg 119.7° C.

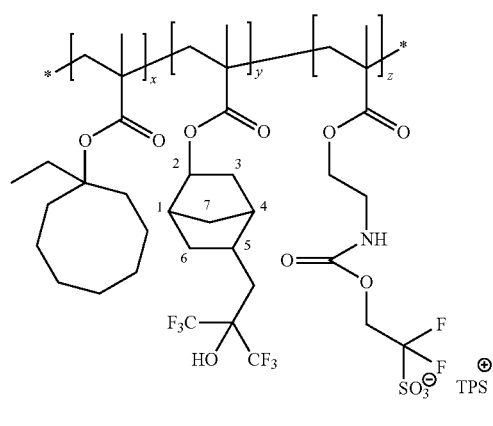

Example 3: with MAdMA, $R^a$=2-methyl-2-adamantyl, x=40, y=55, z=5; GPC (versus polystyrene standards) Mn 2861; Mw 3652; Tg 151.02° C.

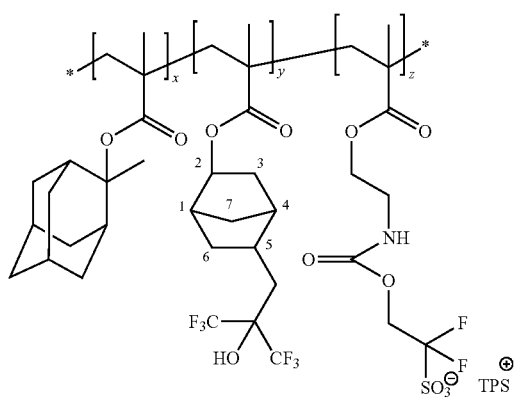

Example 4: with ECPMA, $R^a$=1-ethyl cyclopentyl, x=40, y=55, z=5; GPC (versus polystyrene standards) Mn 2776; Mw 3541; Tg 134.79° C.

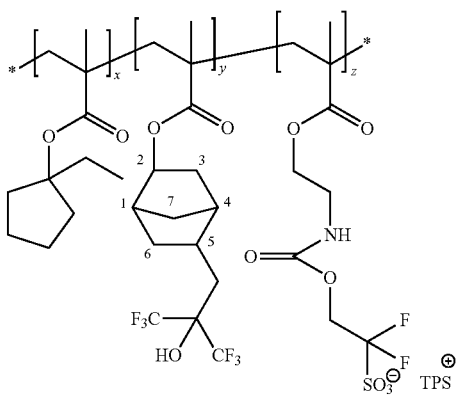

Example 5: with MCPMA, $R^a$=1-methyl cyclopentyl, x=40, y=55; z=5; GPC (versus polystyrene standards) Mn 3350, Mw 4445; Tg 137.76° C.

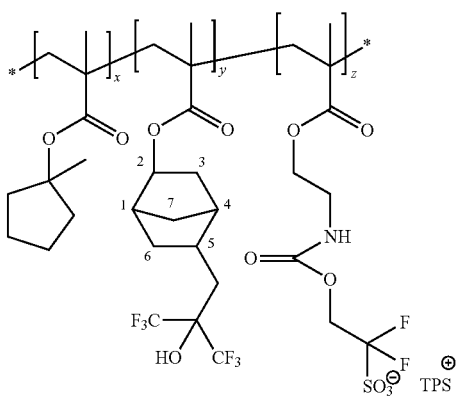

Example 6: with EAdMA, $R^a$=2-ethyl-2-adamantyl, x=40; y=55; z=5; GPC (versus polystyrene standards) Mn 3013; Mw 3673; Tg 143.39° C.

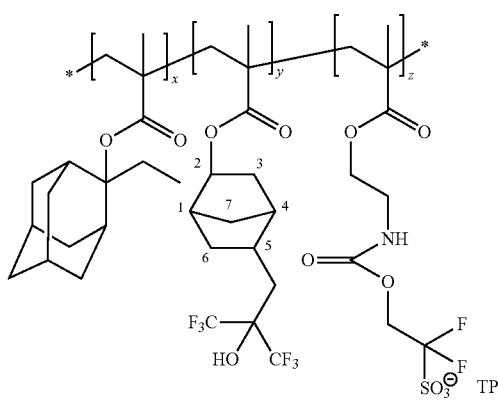

Table 2 summarizes Examples 1-6.

TABLE 2

| Example | Comonomer | R$^a$ | x (mol %) | y (mol %) | z (mol %) |
|---|---|---|---|---|---|
| 1 | TBMA | t-Butyl | 40 | 55 | 5 |
| 2 | ECOMA | 1-Ethyl Cyclooctyl | 40 | 55 | 5 |
| 3 | MAdMA | 2-Methyl-2-Adamantyl | 40 | 55 | 5 |
| 4 | ECPMA | 1-Ethyl Cyclopentyl | 40 | 55 | 5 |
| 5 | MCPMA | 1-Methyl Cyclopentyl | 40 | 55 | 5 |
| 6 | EAdMA | 2-Ethyl-2-Adamantyl | 40 | 55 | 5 |

Examples 7 to 8

Using the general polymerization procedure described above, copolymers were prepared by replacing NbHFAMA with hydroxystyrene monomer (SOH) according to the general reaction:

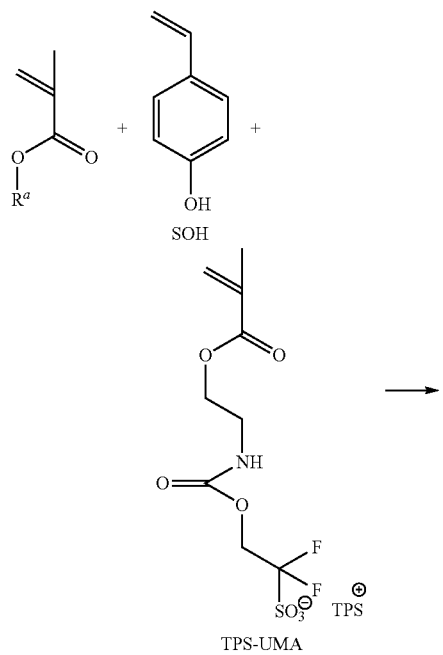

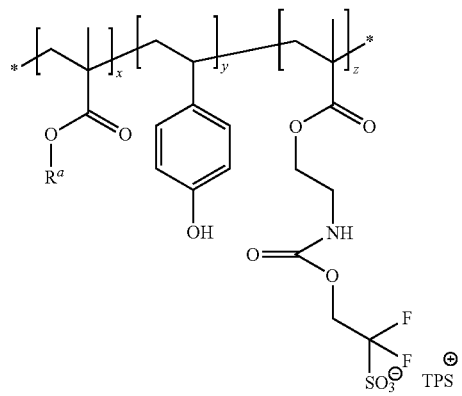

Comparative Example 7: with ECOMA, R$^a$=1-ethyl cyclooctyl, x=40, y=57.5, z=2.5; GPC (versus polystyrene standards) Mn 5759, Mw 7065, Tg 108.75° C.

Comparative Example 8: with TBMA, R$^a$=t-butyl, x=40, y=57.5, z=2.5; GPC (versus polystyrene standards) Mn 3777, Mw 5754, Tg very weak.

Table 3 summarizes Examples 7-8.

TABLE 3

| Example | Comonomer | R$^a$ | x (mol %) | y (mol %) | z (mol %) |
|---|---|---|---|---|---|
| 7 (comp.) | ECOMA | 1-Ethyl Cyclooctyl | 40 | 57.5 | 2.5 |
| 8 (comp.) | TBMA | t-Butyl | 40 | 57.5 | 2.5 |

Examples 9 to 13

Using the general polymerization procedure described above, copolymers were prepared comprising NbHFAMA, NLM, TPS-UMA and additional comonomer according to the general reaction:

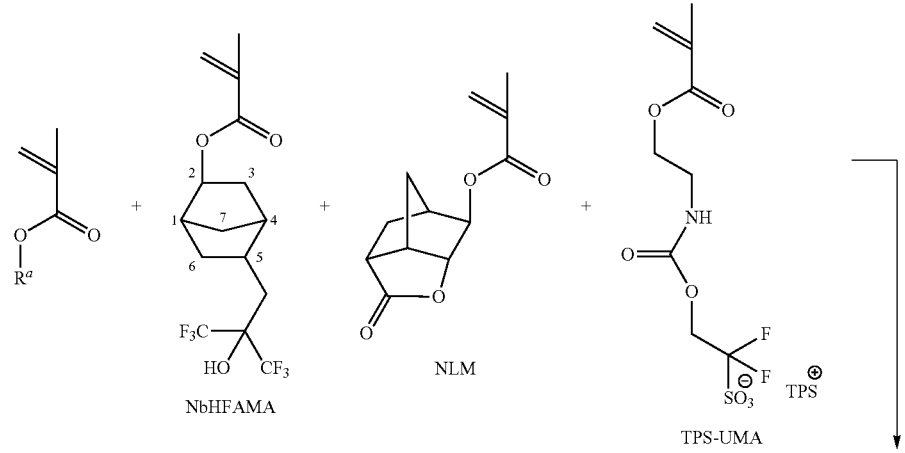

-continued

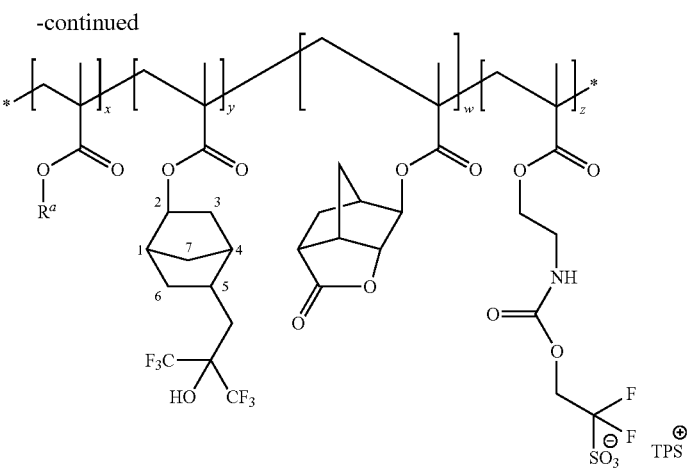

The following polymers give photoresist formulations which produce high contrast images with EUV or 193 nm patterning exposure.

Example 9: with TBMA, $R^a$=t-butyl, x=45; y=15; w=35; z=5; GPC (versus polystyrene standards) Mn 1898, Mw 2755, Tg 136.88° C.

Example 10: with ECPMA, $R^a$=1-ethyl cyclopentyl, x=40; y=15; w=40; z=5; GPC (versus polystyrene standards) Mn 2436, Mw 3423; Tg 133.7° C.

Example 11: with MAdMA, $R^a$=2-methyl-2-adamantyl, x=40; y=15; w=40; z=5; GPC (versus polystyrene standards) Mn 2201, Mw 3081, Tg 162.7° C.

Example 12: with EAdMA, $R^a$=2-ethyl-2-adamantyl, x=40; y=15; w=40; z=5; GPC (versus polystyrene standards) Mn 1868, Mw 2672, Tg 145.58° C.

Example 13: with ECOMA, $R^a$=1-ethyl cyclooctyl, x=40; y=15; w=40; z=5; GPC (versus polystyrene standards) Mn 2503, Mw 2977, Tg 122.46° C.

Table 4 summarizes Examples 9-13.

TABLE 4

| Example | Co-monomer | $R^a$ | x (mol %) | y (mol %) | w (mol %) | z (mol %) |
|---|---|---|---|---|---|---|
| 9 | TBMA | t-Butyl | 45 | 15 | 35 | 5 |
| 10 | ECPMA | 1-Ethyl Cyclopentyl | 40 | 15 | 40 | 5 |
| 11 | MAdMA | 2-Methyl-2-Adamantyl | 40 | 15 | 40 | 5 |
| 12 | EAdMA | 2-Ethyl-2-Adamantyl | 40 | 15 | 40 | 5 |
| 13 | ECOMA | 1-Ethyl Cyclooctyl | 40 | 15 | 40 | 5 |

Example 14

Using the general polymerization procedure described above, a copolymer was prepared comprising NbNHCF3SO2MA, NLM, TPS-UMA and an additional comonomer according to the general reaction:

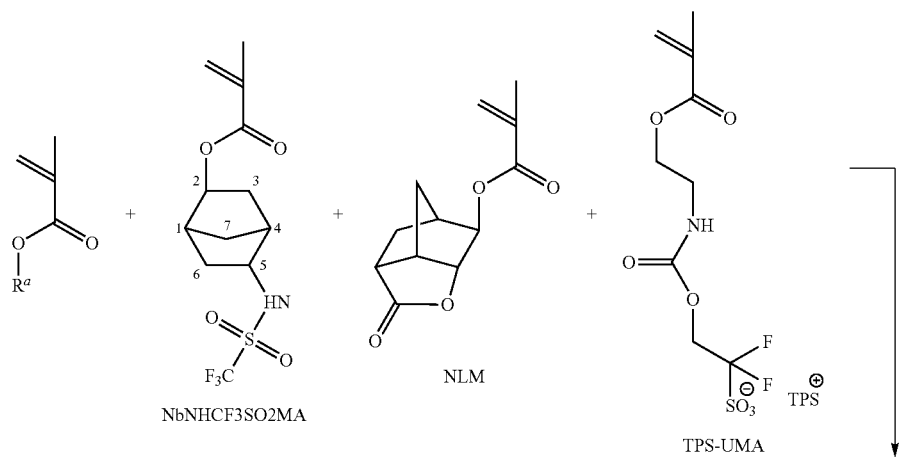

-continued

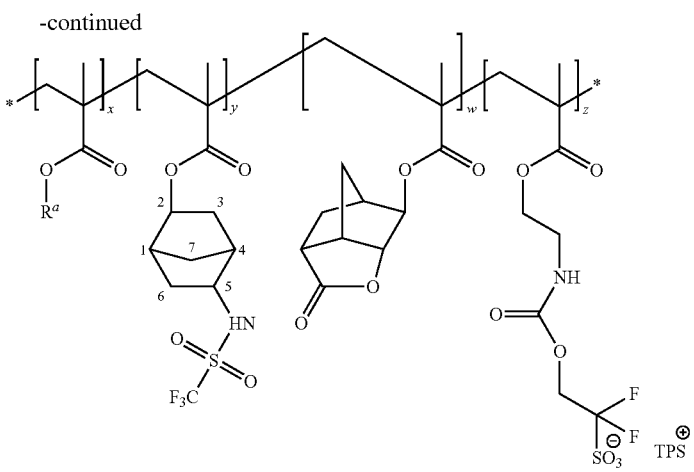

Example 14: with TBMA, $R^a$=t-butyl, $R^b$=methyl; x=40; y=15; w=35; z=5; Tg 133.80° C.

Table 5 summarizes Example 14.

TABLE 5

| Example | Comonomer | $R^a$ | x (mol %) | y (mol %) | w (mol %) | z (mol %) |
|---------|-----------|-------|-----------|-----------|-----------|-----------|
| 14 | TBMA | t-Butyl | 40 | 15 | 35 | 5 |

Photoresist Evaluation.

The following general procedure is representative of the preparation of photoresist formulations. The copolymer of Example 5 (0.6 grams) above was dissolved in propylene glycol methyl ether (20 grams). This solution served as a photoresist composition without additional additives. The solution was filtered through a 0.2 micrometer filter before use. If desired, a small amount of base (0.3 weight percent based on weight of the polymer of Example 5) such as tetraethyl ammonium hydroxide and/or 2-phenyl benzimidazole) could be used along with surfactant additives.

Figure 3:
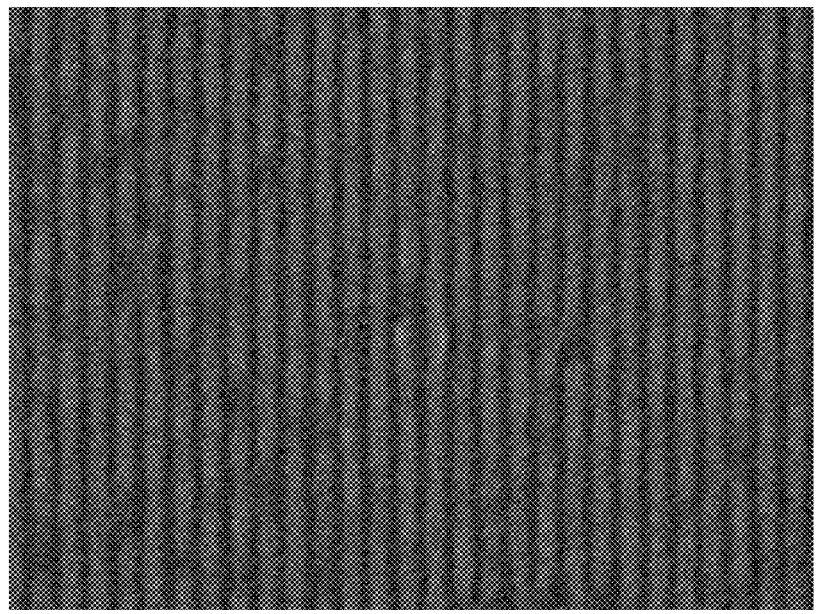
FIG. 3 is a scanning electron micrograph (SEM) of a 22 nm line/space pattern produced by the PAG polymer of Example 1 using a post exposure bake of 135° C.
Figure 4:
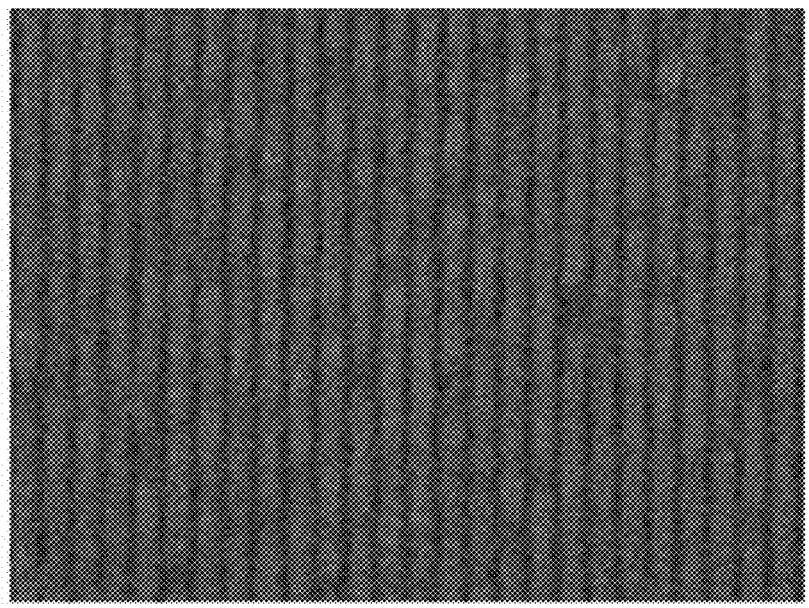
FIG. 4 is an SEM of a 24 nm line/space pattern produced by the PAG polymer of Example 2 using a post exposure bake of 110° C.
Figure 5:
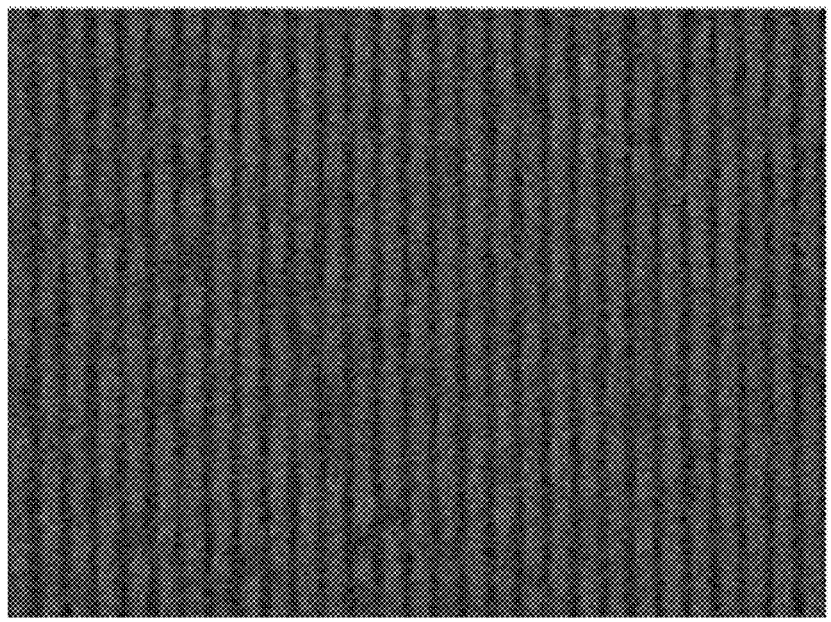
FIG. 5 is an SEM of a 22 nm line/space pattern produced by the PAG polymer of Example 4 using a post exposure bake of 120° C.
Figure 6:
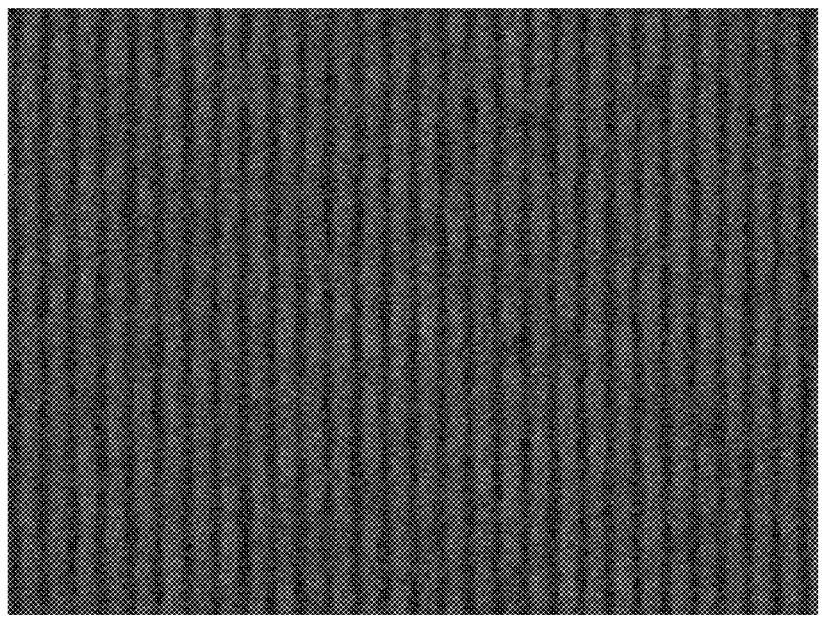
FIG. 6 is an SEM of a 22 nm line/space pattern produced by the PAG polymer of Example 5 using a post exposure bake of 120° C.
Figure 7:
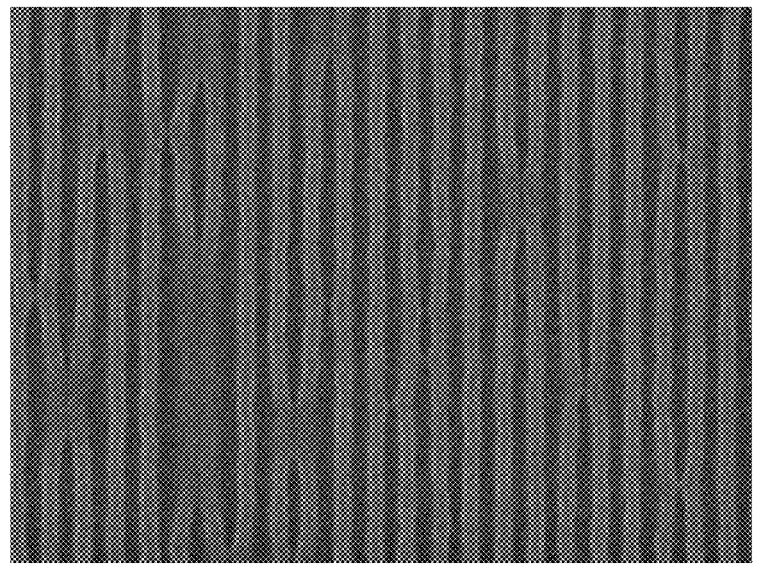
FIG. 7 is an SEM of a 26 nm line/space pattern produced by the PAG polymer of Example 10 using a post exposure bake of 120° C.
Figure 8:
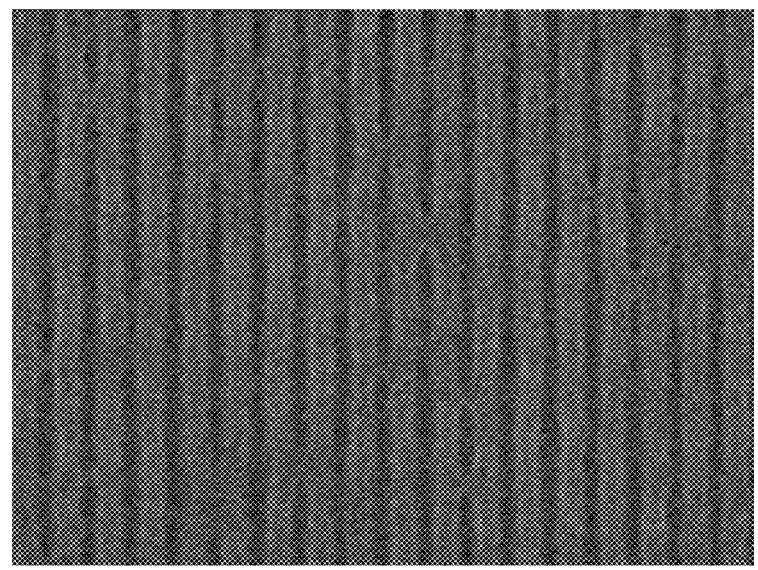
FIG. 8 is an SEM of a 32 nm line/space pattern produced by the PAG polymer of Example 14 using a post exposure bake of 130° C.

A silicon substrate was coated with a 45 nm to 80 nm film of the photoresist formulation described above by spin coating. The coating was baked at 110° C. for 60 seconds to drive off residual solvent. The photoresist film was then patternwise exposed using 13.2 nm EUV radiation at doses ranging from 5 mJ/cm$^2$ to 30 mJ/cm$^2$, followed by a post exposure bake at temperatures ranging from 90° C. to 135° C. (see sample SEM photos for sample PEB temperatures) for 60 seconds. In all cases the coating was developed with 0.263N tetramethyl ammonium hydroxide solution in a spray developer tool. After development, line/space patterns exhibiting sharp contrast down to 22 nm line/space dimensions were obtained. FIG. 3 is a scanning electron micrograph (SEM) of a 22 nm line/space pattern produced by the PAG polymer of Example 1 using a post exposure bake of 135° C. FIG. 4 is an SEM of a 24 nm line/space pattern produced by the PAG polymer of Example 2 using a post exposure bake of 110° C. FIG. 5 is a 22 nm line/space pattern produced by the PAG polymer of Example 4 using a post exposure bake of 120° C. FIG. 6 is an SEM of a 22 nm line/space pattern produced by the PAG polymer of Example 5 using a post exposure bake of 120° C. FIG. 7 is an SEM of a 26 nm line/space pattern produced by the PAG polymer of Example 10 using a post exposure bake of 120° C./60 seconds. FIG. 8 is an SEM of a 32 nm line/space pattern produced by the PAG polymer of Example 14 using a post exposure bake of 130° C./60 seconds.

The resolution of the line/space patterns obtained with the bound PAG polymers is, in general, 50% to 100% better than similar materials in which the PAG is not bound to the polymer. The PAG polymers also exhibit comparable or improved line/space resolution relative to TPS-UMA containing PAG copolymers that do not contain repeat units derived from NbHFAMA and/or NbNHCF3SO2MA, which have line/space resolution limits of about 28 nm. That is, the combination TPS-UMA with NbHFAMA and/or NbNHCF3SO2MA results in measurable improvement in line/space resolution using EUV or 193 nm exposures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A photoacid generating polymer (PAG polymer), comprising:

a first repeat unit of formula (1):

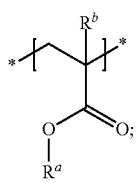

(1)

wherein $R^a$ is an acid sensitive group and $R^b$ is hydrogen or methyl, wherein the first repeat unit is capable of reacting with a photogenerated acid to form a carboxylic acid containing repeat unit;

a second repeat unit of formula (2):

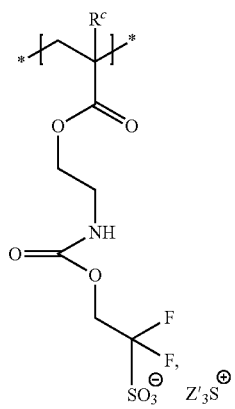

(2)

wherein $R^c$ is hydrogen or methyl, and $Z'_3S^\oplus$ is a triarylsulfonium counterion, and each Z' is an independent monovalent aryl group, wherein the second repeat unit is capable of forming the photogenerated acid; and a third repeat unit comprising a norbornyl ester, wherein a norbornyl ring of the norbornyl ester comprises a monovalent substituent having the formula *-L'-C(CF$_3$)$_2$(OH), wherein L' is a divalent linking group comprising at least one carbon and the starred bond of L' is linked to the norbornyl ring;

wherein the first repeat unit, second repeat unit, and the third repeat unit are covalently bound repeat units of the PAG polymer.

2. The PAG polymer of claim 1, wherein $R^a$ is selected from the group consisting of t-butyl, 1-ethyl-1-cyclopentyl, 1-methyl-1-cyclopentyl, 1-ethyl-1-cyclooctyl, 2-ethyl-2-adamantyl, 2-methyl-2-adamantyl, and combinations thereof.

3. The PAG polymer of claim 1, wherein $R^b$ and $R^c$ are methyl.

4. The PAG polymer of claim 1, wherein the third repeat unit is a mixture of structural isomers.

5. The PAG polymer of claim 1, wherein the third repeat unit is a single structural isomer.

6. The PAG polymer of claim 1, wherein the third repeat unit is a mixture of stereoisomers.

7. The PAG polymer of claim 1, wherein the third repeat unit is a single stereoisomer.

8. The PAG polymer of claim 1, wherein each Z' is phenyl and $Z'_3S^\oplus$ is a triphenylsulfonium ion (TPS$^\oplus$).

9. The PAG polymer of claim 1, wherein the third repeat unit has the formula (3):

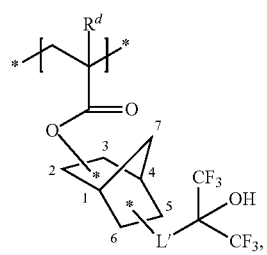

(3)

wherein $R^d$ is hydrogen or methyl and L' is a divalent linking group comprising at least one carbon.

10. The PAG polymer of claim 5, wherein the norbornyl ring further comprises an alkyl and/or cycloalkyl substituent.

11. The PAG polymer of claim 1, wherein the third repeat unit is:

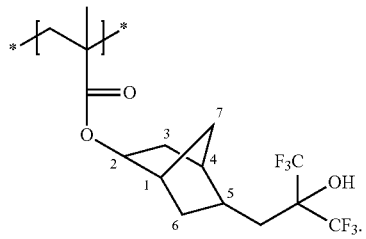

12. The PAG polymer of claim 1, wherein the first repeat unit is present in an amount of about 30 to about 45 mole percent based on total moles of repeat units in the PAG polymer.

13. The PAG polymer of claim 1, wherein the second repeat unit is present in an amount of about 2.5 to about 8 mole percent based on total moles of repeat units in the PAG polymer.

14. The PAG polymer of claim 1, wherein the third repeat unit is present in an amount of about 15 to about 55 mole percent based on total moles of repeat units in the PAG polymer.

15. The PAG polymer of claim 1, comprising a fourth repeat unit of formula (5):

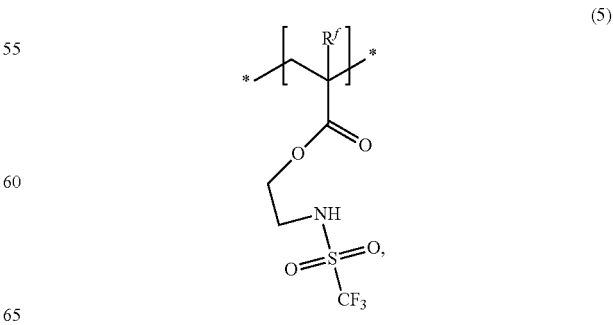

(5)

wherein $R^f$ is hydrogen or methyl.

16. The PAG polymer of claim 1, comprising a fourth repeat unit of formula (6):

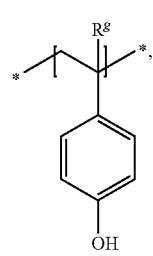

(6)

wherein $R^g$ is hydrogen or methyl.

17. The PAG polymer of claim 1, comprising a fourth repeat unit comprising a pendant lactone.

18. The PAG polymer of claim 17, wherein the fourth repeat unit is selected from the group consisting of

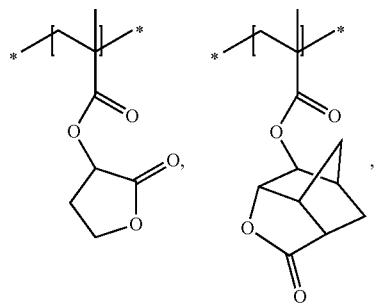

and combinations thereof.

19. A photoacid generating polymer (PAG polymer), comprising:
a first repeat unit of formula (1):

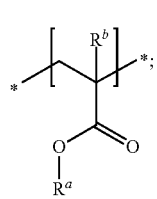

(1)

wherein $R^a$ is an acid sensitive group and $R^b$ is hydrogen or methyl, wherein the first repeat unit is capable of reacting with a photogenerated acid to form a carboxylic acid containing repeat unit;
a second repeat unit of formula (2):

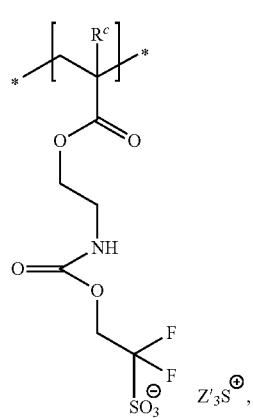

(2)

wherein $R^c$ is hydrogen or methyl, and $Z'_3S^\oplus$ is a triarylsulfonium counterion, and each $Z'$ is an independent monovalent aryl group, wherein the second repeat unit is capable of forming the photogenerated acid; and
a third repeat unit comprising a norbornyl ester, wherein a norbornyl ring of the norbornyl ester comprises a monovalent substituent having the formula *-L'-NHS(=O)$_2$(CF$_3$), wherein L' is a divalent linking group comprising at least one carbon and the starred bond of L' is linked to the norbornyl ring;
wherein the first repeat unit, the second repeat unit, and the third repeat unit are covalently bound repeat units of the PAG polymer.

20. The PAG polymer of claim 19, wherein the third repeat unit has the formula (4):

(4)

wherein $R^e$ is hydrogen or methyl and L' is a divalent linking group comprising at least one carbon.

21. The PAG polymer of claim 19, wherein the third repeat is:

22. A method of preparing a photoacid generating polymer (PAG polymer), comprising:
forming a reaction mixture comprising:
i) a solvent,
ii) a polymerization initiator,
iii) a first polymerizable monomer of formula (7):

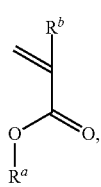

(7)

wherein $R^a$ is an acid sensitive group and $R^b$ is hydrogen or methyl, wherein the first polymerizable monomer is capable of forming a first repeat unit, the first repeat unit capable of reacting with a photogenerated acid to form a carboxylic acid containing repeat unit;

iv) a second polymerizable monomer of formula (8):

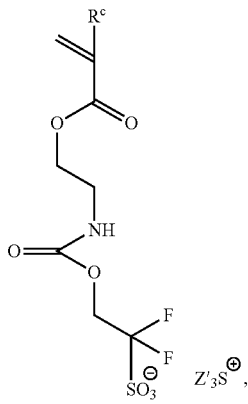

wherein $R^c$ is hydrogen or methyl, and $Z'_3S^\oplus$ is a triarylsulfonium counterion wherein each Z' is an independent monovalent aryl group, and wherein the second polymerizable monomer is capable of forming a second repeat unit, the second repeat unit capable of forming the photogenerated acid; and v) a third polymerizable monomer comprising a norbornyl ester, wherein a norbornyl ring of the norbornyl ester comprises a monovalent substituent having the formula *-L'-C(CF$_3$)$_2$(OH), wherein L' is a divalent linking group comprising at least one carbon and the starred bond of L' is linked to the norbornyl ring, and wherein the third polymerizable monomer is capable of forming a third repeat unit comprising a norbornyl ester; and agitating and optionally heating the mixture, thereby forming the PAG polymer, wherein the first repeat unit, the second repeat unit, and the third repeat unit are covalently bound repeat units of the PAG polymer.

23. The method of claim 22, wherein the third polymerizable monomer has the formula (9):

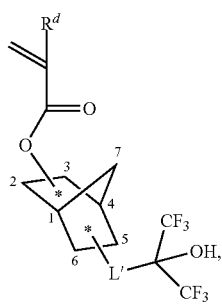

wherein $R^d$ is hydrogen or methyl and L' is a divalent linking group comprising at least one carbon.

24. The method of claim 22, wherein the third polymerizable monomer is NbHFAMA:

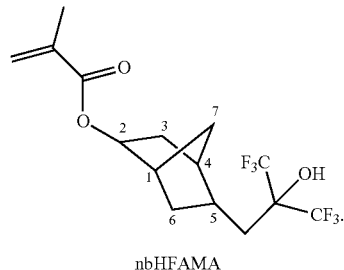

nbHFAMA

25. The method of claim 22, wherein $R^a$ is selected from the group consisting of t-butyl, 1-ethyl-1-cyclopentyl, 1-methyl-1-cyclopentyl, 1-ethyl-1-cyclooctyl, 2-ethyl-2-adamantyl, and 2-methyl-2-adamantyl, and combinations thereof.

26. A method of preparing a photoacid generating polymer (PAG polymer), comprising:
forming a reaction mixture comprising:
i) a solvent,
ii) a polymerization initiator,
iii) a first polymerizable monomer of formula (7):

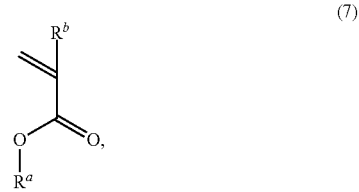

wherein $R^a$ is an acid sensitive group and $R^b$ is hydrogen or methyl, wherein the first polymerizable monomer is capable of forming a first repeat unit, the first repeat unit capable of reacting with a photogenerated acid to form a carboxylic acid containing repeat unit;

iv) a second polymerizable monomer of formula (8):

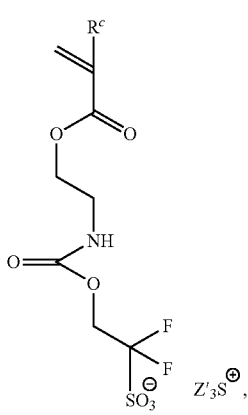

wherein $R^c$ is hydrogen or methyl, and $Z'_3S^\oplus$ is a triarylsulfonium counterion wherein each Z' is an independent monovalent aryl group, and wherein the second polymerizable monomer is capable of forming a second repeat unit, the second repeat unit capable of forming the photogenerated acid; and v) a third polymerizable monomer comprising a norbornyl ester, wherein a norbornyl ring of the norbornyl ester comprises a monovalent substituent having the formula *-L'-NHS(=O)$_2$(CF$_3$), wherein L' is a divalent linking group comprising at least one carbon and the starred bond of L' is linked to the norbornyl ring, and wherein the third polymerizable monomer is capable of forming a third repeat unit comprising a norbornyl ester; and agitating and optionally heating the mixture, thereby forming the PAG polymer, wherein the first repeat unit, the second repeat unit, and the third repeat unit are covalently bound repeat units of the PAG polymer.

27. The method of claim 26, wherein the third polymerizable monomer has the formula (10):

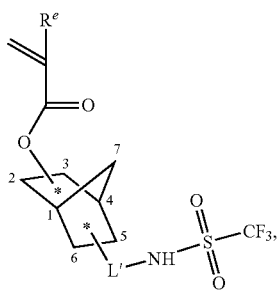

(10)

wherein each R$^e$ is hydrogen or methyl and L' is a divalent linking group comprising at least one carbon.

28. The method of claim 26, wherein the third polymerizable monomer is NbNHCF3SO2MA:

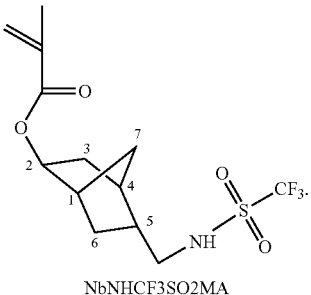

NbNHCF3SO2MA

NbNHCF3SO2MA.

29. A photoresist composition, comprising the PAG polymer of claim 1, a solvent, and an optional base quencher.

30. A photoresist composition, comprising the PAG polymer of claim 19, a solvent, and an optional base quencher.

31. A lithographic process comprising:
disposing on a substrate a photoresist composition comprising the PAG polymer of claim 1, a solvent, and an optional base quencher;
removing the solvent, thereby forming a photoresist layer disposed on the substrate;
optionally heating the photoresist layer in a post-application bake;
imagewise exposing the photoresist layer or the heated photoresist layer to a radiation, thereby forming an exposed photoresist layer comprising regions of exposed photoresist and regions of non-exposed photoresist;
optionally heating the exposed photoresist layer in a post-exposure bake;
treating the exposed photoresist layer or the heated exposed photoresist layer with a developer, thereby forming a relief pattern; and
optionally transferring the relief pattern to the substrate.

32. The process of claim 31, wherein the developer is an aqueous base, and the developer removes regions of exposed photoresist.

33. A lithographic process comprising:
disposing on a substrate a photoresist composition comprising the PAG polymer of claim 19, a solvent, and an optional base quencher;
removing the solvent, thereby forming a photoresist layer disposed on the substrate;
optionally heating the photoresist layer in a post-application bake;
imagewise exposing the photoresist layer or the heated photoresist layer to a radiation, thereby forming an exposed photoresist layer comprising regions of exposed photoresist and regions of non-exposed photoresist;
optionally heating the exposed photoresist layer in a post-exposure bake;
treating the exposed photoresist layer or the heated exposed photoresist layer with a developer, thereby forming a relief pattern; and
optionally transferring the relief pattern to the substrate.

* * * * *